United States Patent
Matei et al.

(10) Patent No.: US 12,307,629 B2
(45) Date of Patent: May 20, 2025

(54) SYSTEM AND METHOD FOR MODEL-PREDICTIVE-CONTROL-BASED MICRO-ASSEMBLY CONTROL WITH THE AID OF A DIGITAL COMPUTER

(71) Applicant: XEROX CORPORATION, Norwalk, CT (US)

(72) Inventors: Ion Matei, Sunnyvale, CA (US); Johan de Kleer, Los Altos, CA (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 18/745,811

(22) Filed: Jun. 17, 2024

(65) Prior Publication Data

US 2024/0338791 A1    Oct. 10, 2024

Related U.S. Application Data

(63) Continuation of application No. 17/098,816, filed on Nov. 16, 2020, now Pat. No. 12,020,399.

(51) Int. Cl.
| | |
|---|---|
| *B81C 99/00* | (2010.01) |
| *B82B 3/00* | (2006.01) |
| *G06T 3/4046* | (2024.01) |
| *G06T 15/00* | (2011.01) |

(52) U.S. Cl.
CPC .......... *G06T 3/4046* (2013.01); *B81C 99/002* (2013.01); *B82B 3/0076* (2013.01); *G06T 15/005* (2013.01); *H01L 2224/75901* (2013.01)

(58) Field of Classification Search
USPC .......................................... 700/97; 382/156
See application file for complete search history.

(56) References Cited

U.S. PATENT DOCUMENTS

| | | |
|---|---|---|
| 6,243,696 B1 | 6/2001 | Keeler |
| 7,332,361 B2 | 2/2008 | Lu et al. |
| 7,651,598 B2 | 1/2010 | Shapiro et al. |
| | (Continued) | |

FOREIGN PATENT DOCUMENTS

| | | |
|---|---|---|
| CN | 101431665 | 5/2009 |
| EP | 1450304 | 8/2004 |
| WO | 2003081527 | 10/2003 |

OTHER PUBLICATIONS

Matei at al., "Micro-Scale Chiplets Position Control" Journal of Microelectromechanical Systems, vol. 28, No. 4, Aug. 2019, p. 643-655 (Year: 2019).*

(Continued)

*Primary Examiner* — Emilio J Saavedra
(74) *Attorney, Agent, or Firm* — Leonid Kisselev

(57) ABSTRACT

System and method that allow to jointly cause movement of multiple micro-and-nano-objects to desired positions are described. A high speed camera tracks the locations of the objects. An array of electrodes is used to generate a dynamic potential energy landscape for manipulating objects with both DEP and EP forces. One or more computing devices are used to: process images captured by the camera to estimate positions of the objects; use model predictive control optimization to obtain trajectories and electrode potentials for moving at least some of the objects from estimated positions to further positions; and control the electrodes based on electrode potentials.

19 Claims, 23 Drawing Sheets

(56) References Cited

U.S. PATENT DOCUMENTS

| | | | |
|---|---|---|---|
| 8,099,265 | B2 | 1/2012 | Houston |
| 8,110,083 | B1 | 2/2012 | Shapiro et al. |
| 9,892,225 | B2 | 2/2018 | Tirapu Azpiroz et al. |
| 9,996,920 | B2 | 6/2018 | Du et al. |
| 10,558,204 | B2 | 2/2020 | Matei |
| 11,242,244 | B2 | 2/2022 | Plochowietz |
| 11,376,591 | B2 | 7/2022 | Lionberger et al. |
| 2002/0108097 | A1 | 8/2002 | Harris et al. |
| 2005/0051429 | A1 | 3/2005 | Shapiro et al. |
| 2005/0125474 | A1 | 6/2005 | Pednault |
| 2005/0149304 | A1 | 7/2005 | Harris et al. |
| 2006/0226013 | A1 | 10/2006 | Decre et al. |
| 2008/0083621 | A1 | 4/2008 | Sideris |
| 2008/0088551 | A1 | 4/2008 | Cernasov |
| 2010/0001666 | A1 | 1/2010 | Johnson et al. |
| 2010/0329536 | A1 | 12/2010 | Muschler et al. |
| 2015/0076961 | A1 | 3/2015 | Thompson et al. |
| 2016/0171686 | A1 | 6/2016 | Du et al. |
| 2016/0351584 | A1 | 12/2016 | Lu et al. |
| 2016/0356696 | A1 | 12/2016 | Lewis et al. |
| 2016/0370266 | A1 | 12/2016 | White et al. |
| 2017/0076909 | A1* | 3/2017 | Al-Fandi ............. H01J 37/20 |
| 2017/0102016 | A1* | 4/2017 | Azpiroz ............. B01L 3/5027 |
| 2017/0221032 | A1 | 8/2017 | Mazed et al. |
| 2018/0081347 | A1 | 3/2018 | Matei |
| 2018/0082826 | A1 | 3/2018 | Guha et al. |
| 2019/0240665 | A1 | 8/2019 | Lionberger et al. |
| 2020/0207617 | A1 | 7/2020 | Plochowietz |
| 2020/0265296 | A1 | 8/2020 | Olabiyi |
| 2020/0342548 | A1 | 10/2020 | Mazed et al. |
| 2021/0316309 | A1 | 10/2021 | Hung et al. |
| 2021/0356951 | A1 | 11/2021 | Matei et al. |
| 2022/0130158 | A1 | 4/2022 | Kim et al. |
| 2022/0143612 | A1 | 5/2022 | Breinlinger et al. |
| 2022/0143819 | A1* | 5/2022 | Tan ................. G06N 3/006 |
| 2022/0147672 | A1 | 5/2022 | Nistala |
| 2022/0152720 | A1 | 5/2022 | Hazui et al. |

OTHER PUBLICATIONS

Chow et al., "Micro-Object Assembly With an Optically Addressed Array" 2017 19th International Conference on Solid-State Sensors, Actuators and Microsystems (Transducers), Jul. 27, 2017, pp. 682-685 (Year: 2017).*

Yang et al. "Data Efficient Reinforcement Learning for Legged Robots" 3rd Conference on Robot Learning (CoRL 2019), Osaka, Japan, 10 pgs., (Year: 2019).*

Kumar, "Introduction to the Gradient Boosting Algorithm", May 2020, Analytics Vidhya, pp. 1-3 (Year: 2020).

Matei et al., "Micro-scale chiplets position control," Journal of Microelectromechanical Systems, 28(4):643-655, Aug. 2019.

Matei et al., "Towards printing as an electronics manufacturing method: Micro-scale chiplet position control," 2017 American Control Conference (ACC), pp. 1549-1555, May 2017.

Wang et al., "Dielectrophoretic manipulation of cells with spiral electrodes," Biophysical Journal, 72(4):1887-1899, 1999.

Tara D. Edwards and Michael A. Bevan, "Controlling colloidal particles with electric fields." Langmuir, 30(36):10793-10803, 2014. PMID: 24601635 ("Edwards").

Qian et al., "On-demand and location selective particle assembly via electrophoretic deposition for fabricating structures with particle-to-particle precision," Langmuir, 31(12):3563-3568, 2015. PMID: 25314133.

Grzelczak et al., "Directed self-assembly of nanoparticles," ACS Nano, 4(7):3591-3605, 2010. PMID: 20568710.

Paulson et al., "Control of self-assembly in micro-and nano-scale systems," Journal of Process Control, 27:38-49, 2015.

Mastrangeli et al., "Automated real-time control of fluidic self-assembly of microparticles," Robotics and Automation (ICRA), 2014 IEEE International Conference on pp. 5860-5865, May 2014.

Martin Abadi et al. TensorFlow: Large-scale machine learning on heterogeneous systems, 2015.

Tolley et al., "Dynamically programmable fluidic assembly," Applied Physics Letters, 93(25), 2008.

Mathai et al., "Simultaneous positioning and orientation of single nano-wires using flow control," RSC Adv., 3:2677-2682, 2013.

Probst et al., "Flow control of small objects on chip: Manipulating live cells, quantum dots, and nanowires," IEEE Control Systems, 32(2):26-53, Apr. 2012.

Camponogara et al., "Distributed model predictive control," Control Systems, IEEE, 22(1):44-52, Feb. 2002.

Garcia et al., "Model predictive control: Theory and practice—A survey," Automatica, 25(3):335-348, 1989.

Matthew Kelly, "An introduction to trajectory optimization: How to do your own direct collocation," SIAM Review, 59 (4):849-904, 2017.

Al-Aradi et al., "Solving nonlinear and high-dimensional partial differential equations via deep learning," 2018.

Nocedal et al., "Numerical Optimization," Springer, New York, NY, USA, second edition, 2006.

A. O'Hagan, "Polynomial Chaos: A Tutorial and Critique from a Statistician's Perspective," University of Sheffield, UK, May 2013.

N. Wiener, "The Homogeneous Chaos," Am. J. Math., vol. 60, No. 4, pp. 897-936, 1938.

D. Xiu, D. Lucor, C.-H. Su, and G. Em Karniadakis, "Performance Evaluation of Generalized Polynomial Chaos," in Computational Science—ICCS 2003: International Conference, Melbourne, Australia and St. Petersburg, Russia, Jun. 2-4, 2003 Proceedings, Part IV, Berlin, Heidelberg, pp. 346-354, 2003.

Maclaurin et al., "Autograd: Effortless gradients in numpy," ICML 2015 AutoML Workshop, 2015.

D. P. Kingma and J. Ba, Adam: A Method for Stochastic Optimization. 2014.

Adam Paszke, Sam Gross, Soumith Chintala, Gregory Chanan, Edward Yang, Zachary DeVito, Zeming Lin, Alban Desmaison, Luca Antiga, and Adam Lerer. Automatic differentiation in pytorch. 2017.

Ralph C. Smith. Uncertainty Quantification: Theory, Implementation, and Applications. Society for Industrial and Applied Mathematics, Philadelphia, PA, USA, 2013.

Xue et al. "Optimal design of a colloidal self-assembly process," IEEE Transactions on Control Systems Technology, 22(5):1956-1963, Sep. 2014.

Xue et al., "Mdp based optimal control for a colloidal self-assembly system," American Control Conference (ACC), 2013, pp. 3397-3402, Jun. 2013.

Edman et al., Electric field directed assembly of an InGaAs LED onto silicon circuitry. IEEE Photonics Technology Letters, 12(9):1198-1200, Sep. 2000.

Zemánek, Jiří, Tomáš Michálek, and Zdenk Hurák. "Phase-shift feedback control for dielectrophoretic micromanipulation." Lab on a Chip 18.12 (2018): 1793-1801.

Rupp et al., "Chiplet micro-assembly printer," 2019 IEEE 69th Electronic Components and Technology Conference (ECTC), pp. 1312-1315, May 2019.

Dongbin Xiu, Didier Lucor, C.-H. Su, and George Em Karniadakis. Performance evaluation of generalized polynomial chaos. In Computational Science—ICCS 2003: International Conference, Melbourne, Australia and St. Petersburg, Russia, Jun. 2-4, 2003 Proceedings, Part IV, pp. 346-354, Berlin, Heidelberg, 2003.

Zoran Zivkovic, "Improved adaptive gaussian mixture model for background subtraction," in Pattern Recognition, 2004. ICPR 2004.

Murran, Capacitance-based droplet position estimator for digital microfluidic devices, www.rsc.org/loc (year: 2012).

Armani, Control of miscrofluidic systems: Two examples, results, and challenges, Int. Journal of Robust and Nonlinear Control. (year: 2005).

Murran, Capacitance-based droplet position sensing optimization through digital microfluidic parameters, ASME 2011 (year: 2011).

Yang, Manipulation of droplets in microfluidic systems, Trends in Analytical Chemistry (Year: 2010).

Pollack et al., Electrowetting-based actuation of liquid droplets for microfluidic applications (e.g. Cite as: Appl. Phys. Lett. 77, 1725 (

(56) References Cited

OTHER PUBLICATIONS

2000); https://doi.org/10.1063/1.1308534 Submitted: May 16, 2000 Accepted: Jul. 12, 2000 Published Online: Sep. 5, 2000 (Year: 2000).

Murran et al. (Capacitance-based droplet position estimator for digital microfluidic devices, 2012) (Year: 2012).

Lee, Jeong Hyun et al., "Mobile Oscillating Bubble Actuated by AC-Electrowetting-on-Dielectric (EWOD) for Microfluidic Mixing Enhancement", May 22, 2012, Sensors and Actuators A 182, Elsevier B.V. (Year: 2012).

http:/web.archive.org/web/20201113180912/https://github.com/google/jax, cached on Nov. 13, 2020.

Chow et al., "Micro-Object Assembly With an Optically Addressed Array" 2017 19th International Conference on Solid-State Sensors, Actuators and Microsystems (Tranducers), Jul. 27, 2017, pp. 682-685 (Year: 2017).

Matei et al., "Micro-scale 2d chiplet position control: a formal approach to policy design." 2020 59th IEEE Conference on Decision and Control (CDC), pp. 5519-5524, 2020.

Gene H. Golub and John H. Welsch. "Calculation of gauss quadrature rules." Technical report, Stanford, CA, USA, 1967.

\* cited by examiner

Electrode potentials at t=0 sec.

Electrode potentials at t=1 sec.

Electrode potentials at t=2 sec.

Electrode potentials at t=3 sec.

Electrode potentials at t=4 sec.

Electrode potentials at t=4.99 sec.

Electrode potentials at t=3 sec.

Electrode potentials at t=4 sec.

SYSTEM AND METHOD FOR MODEL-PREDICTIVE-CONTROL-BASED MICRO-ASSEMBLY CONTROL WITH THE AID OF A DIGITAL COMPUTER

FIELD

This application relates in general to micro-assembly control, and in particular, to a system and method for multi-object micro-assembly control with the aid of a digital computer.

BACKGROUND

Micro- and nano-scale particle manipulation has received a lot of research interest. The degree to which control can be exercised over assembly of micro-objects, objects whose dimensions measure in microns, and nano-objects, objects whose dimensions measure in nanometers, can make a significant difference in a number of technologies, including in micro-fabrication, biology and medicine. For example, manufacturing of reconfigurable electrical circuits can be improved by being able to accurately control position of micro-objects such as capacitors and resistors to manufacture a circuit with a desired behavior. Similarly, production of photovoltaic solar cell arrays can benefit from being able to put photovoltaic cells with certain qualities into particular positions on the arrays. Such cells can be too small to allow for a desired placement of the cells via human or robotic manipulation, and another kind of transportation mechanism is needed. Micro-assembly and nano-assembly of particles can also be used to engineer the microstructure of materials, such as of biological cells being assembled into tissue. Many other technological fields exist where increasing control over assembly of micro-and-nano objects can provide significant benefits.

Existing techniques do not allow for control of movement of micro-and-nano-objects with the required degree of precision. For example, uncontrolled mechanical agitation is typically used for directed particle assembly. However, this technique fails to achieve the near 100% yield necessary for certain industrial applications, such as electronics assembly.

Previous work has also attempted to use an electric field to direct movement of micro-objects. For example, in Matei et al., "Micro-scale chiplets position control," *Journal of Microelectromechanical Systems,* 28(4):643-655, August 2019, and Matei et al., "Towards printing as an electronics manufacturing method: Micro-scale chiplet position control," 2017 *American Control Conference (ACC),* pages 1549-1555, May 2017, the disclosures of which are incorporated by reference, a micro-chiplet control policy based on a one-step model predictive control approach is disclosed. The one-dimensional model disclosed is capacitance-based, but the actuation mechanism used was based on spiral-shaped electrode, which limited the number of simultaneously actuated electrodes that can be used by the model. Further, the sizes of the particles whose movement was controlled was assumed to be small enough not to disturb the electric field, which can limit applicability of the described techniques with larger particles.

Likewise, in Wang et al., "Dielectrophoretic manipulation of cells with spiral electrodes," *Biophysical Journal,* 72(4): 1887-1899, 199, describes studying the effect of dielectrophoresis on cancer cells]. This work assumes that the particules involved are spherical and small enough so that the electric field is not disturbed by their presence, limiting the applicability of the described techniques.

A control scheme for individual and ensemble control of colloids is described by Tara D. Edwards and Michael A. Bevan, "Controlling colloidal particles with electric fields." *Langmuir,* 30(36):10793-10803, 2014. PMID: 24601635 ("Edwards"), the disclosure of which is incorporated by reference. In particular, Edwards shows how inhomogeneous electric fields are used to manipulate individual and ensembles of colloidal particles (1 μm to 3 μm diameter) in water and sodium hydroxide solutions through electrophoresis and electroosmosis. The relative size of the colloids to the electrodes employed to generate the field, the medium in which the particles were immersed, and the resulting mathematical models, do not allow the described techniques to be used in certain industrial applications. In particular, the described techniques are not suitable for assembling micro-objects even slightly larger than those discussed in the Edwards paper. Further, the control schemes used involve high frequency signals (MHz), which further limits the applicability of such techniques.

Similarly, Qian et al., "On-demand and location selective particle assembly via electrophoretic deposition for fabricating structures with particle-to-particle precision," *Langmuir,* 31(12):3563-3568, 2015. PMID: 25314133, the disclosure of which is incorporated by reference, demonstrated single particle precision and location selective particle deposition, where electrophoretic forces are the primary drive for particle (2 μm polystyrene beads) manipulation. The control scheme employed was based on building large energy wells close to the desired location of the nano-particles. However, the described techniques does not allow for adequate sorting and placement of individual objects. Further, the described techniques do not allow to adequately manipulate asymmetric objects such as semiconductor chips, which require orientation control to be used to build up electronic systems.

Several works, such as Xue et al., "Optimal design of a colloidal self-assembly process," *IEEE Transactions on Control Systems Technology,* 22(5):1956-1963, September 2014, and Xue et al., "Mdp based optimal control for a colloidal self-assembly system," *American Control Conference (ACC),* 2013, pages 3397-3402, June 2013, the disclosures of which are incorporated by reference, describe controlling a stochastic colloidal assembly process that drive the system to the desired high-crystallinity state and that are based on a Markov-Decision Process optimal control policy. The dynamic model is based on actuator-parametrized Langevin equations. However, in these works, individual particles are not directly manipulated and how this approach can be used when assembling electrical circuits is unclear. Moreover, the size of the particles used (≈3 μm in diameter) is small to the extent that they pose little disturbance to the electric field that is completely shaped by an actuation potentials. In addition, the time scale for achieving the desired state would make the goal of high throughput using this approach challenging to achieve.

Other self-assembly control approaches, such as described by Grzelczak et al., "Directed self-assembly of nanoparticles," *ACS Nano,* 4(7):3591-3605, 2010. PMID: 20568710; Paulson et al., "Control of self-assembly in micro- and nano-scale systems," *Journal of Process Control,* 27:38-49, 2015; Mastrangeli et al., "Automated real-time control of fluidic self-assembly of microparticles," *Robotics and Automation (ICRA),* 2014 *IEEE International Conference* on pages 5860-5865, May 2014; and Paulson et al., "Control of self-assembly in micro- and nano-scale systems," *Journal of Process Control,* 27:38-49, 2015, the disclosures of which are incorporated by reference, do not, as they are, allow to easily scale the number of objects being moved.

Water-based solution in which particles are immersed is a popular choice of control medium, such as described by Edman et al., "Electric field directed assembly of an ingaas led onto silicon circuitry. *IEEE Photonics Technology Letters,* 12(9):1198-1200, September 2000 and Tolley et al., "Dynamically programmable fluidic assembly," *Applied Physics Letters,* 93(25), 2008, the disclosures of which are incorporated by reference. In such cases, both electrophoretic forces as well as fluid motions of electro-osmotic flows are used to drive particles. However, water does not behave like a dielectric, hence cannot generate electric fields, resulting in lower forces for moving objects, thus significantly limiting the size of objects that can be moved using this setup.

Accurate control of cells, quantum dots and nano-wires bases on electroosmosis is used in Mathai et al., "Simultaneous positioning and orientation of single nano-wires using flow control," *RSC Adv.,* 3:2677-2682, 2013 and Probst et al., "Flow control of small objects on chip: Manipulating live cells, quantum dots, and nanowires," *IEEE Control Systems,* 32(2):26-53, April 2012, the disclosures of which are incorporated by reference. The authors use linear models of the electrodes potentials, and the particles effect on the electric field distribution is negligible. However, the presented linearity in the electrodes potentials does not hold when driving forces are primarily dielectrophoretic, thus limiting the applicability of these techniques. Further, the presented linearity may not hold with objects on a micro-scale.

Finally, Zeminek et al., 'Feedback-controlled dielectrophoretic micromanipulation," 2018 *International Conference on Manipulation, Automation and Robotics at Small Scales (MARSS),* July 2018, the disclosure of which is incorporated by reference, describe a dielectrophoresis-based feedback for micro-sphere manipulation. The authors use a simulated annealing approach for solving the optimal control problem, where they take advantage of a sphere-like shape of the particle when building the system model. However, due to the dependence of this technique on the spherical shape of the particle being moved, limits the applicability of the technique.

Therefore, there is a need for an easily scalable way to control assembly involving multiple micro-objects and nano-objects of varying shapes.

SUMMARY

System and method that allow to jointly cause movement of multiple micro-and-nano-objects to desired positions are described. A high speed camera tracks the locations of the objects. An array of photo-transistor-controlled electrodes is used to generate a dynamic potential energy landscape for manipulating objects with both DEP and EP forces, and a video projector is used actuate the array. One or more computing devices are used to: process images captured by the camera to estimate positions of the objects; generate desired trajectories of the objects using an objective function; compare the desired chiplet positions with current positions and generate input signals to minimize the error between them; and map the control inputs to images that are projected on the array using a video project. The projected images activate or deactivate electrodes, as indicated by the control inputs.

In one embodiment, a system and method for multi-object micro-assembly control with the aid of a digital computer are disclosed. One or more parameters of a system for positioning a plurality of chiplets are obtained, each of the chiplets including a micro-object, the system comprising a plurality of electrodes, the electrodes configured to induce a movement of the chiplets when the chiplets are suspended in a fluid proximate to the electrodes upon a generation of one or more electric potentials by one or more of the electrodes. Capacitance between the chiplets and the electrodes and the electrodes and capacitance between the chiplets is modeled based on the parameters of the system. Positions of the chiplets are estimated based on images taken by at least one camera. Further positions of at least some of the chiplets are received. Model predictive control (MPC) optimization is performed to derive based on the capacitance modeling a control scheme for moving the at least some chiplets from the positions to the further positions along trajectories and the electrode potentials necessary for the at least some chiplets to travel the along trajectories, wherein the trajectories are parametrized as smooth, time-dependent functions during the MPC optimization and the electrode potentials are parametrized as smooth time-and-space-dependent functions during the MPC optimization. The electrodes are controlled to generate the electrode potentials in the control scheme. The steps are performed by processors that include at least one of one or more graphics processing units (GPUs) and one or more of tensor processing units (TPUs).

Still other embodiments of the present invention will become readily apparent to those skilled in the art from the following detailed description, wherein is described embodiments of the invention by way of illustrating the best mode contemplated for carrying out the invention. As will be realized, the invention is capable of other and different embodiments and its several details are capable of modifications in various obvious respects, all without departing from the spirit and the scope of the present invention. Accordingly, the drawings and detailed description are to be regarded as illustrative in nature and not as restrictive.

DETAILED DESCRIPTION

Control policies that allow to jointly control movement of multiple micro-and-nano-objects are described below. The control policies are computed as a solution of an Model Predictive Control (MPC) formulation. Unlike typical local parametrization of state and input trajectories, global parametrizations are used, where the object trajectories are represented as time-dependent, parameterized smooth maps. Time-and-space-dependent smooth parameterized maps are used to represent the electrode potentials, thus avoiding having to consider each electrode potential as a separate input. Moreover, such a parameterization scales up with the number of electrodes. Automatic differentiation are used to compute time derivatives of state variables, gradients of potential functions and loss functions, and jacobian matrices of constraints belonging to the MPC formulation.

Figure 1:
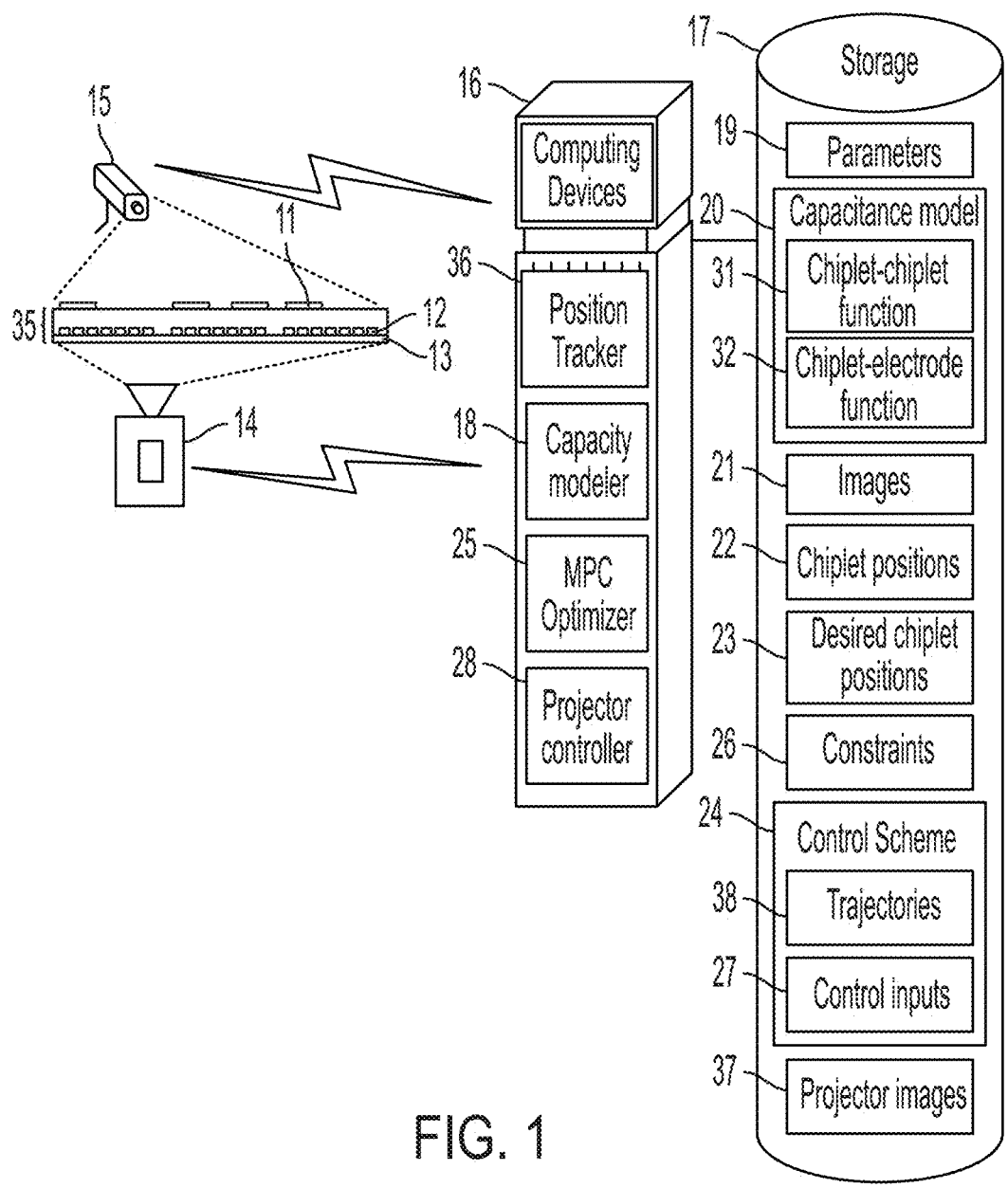
FIG. 1 is a block diagram showing a system for multi-object micro-assembly control with the aid of a digital computer

FIG. 1 is a block diagram showing a system for multi-object micro-assembly control with the aid of a digital computer. The system allows for coordinated assembly involving multiple objects 11, such as micro-objects. The size of the objects 11 vary between being on the nano scale (<1 μm), and micro-scale (as much as 100s of μm), though other sizes are possible. The objects 11 can be spherical, though other shapes are also possible, such as a rectangular shape, though still other shapes are also possible. In one embodiment, the diameter of the sperical objects 11 can be 20 μm to 50 μm, though other diameters are also possible. In one embodiment, the dimension of the rectangular objects 11 can be 200 μm×300 μm×100 μm, though other dimensions are also possible. The objects 11 are immersed in a dielectric fluid contained within an enclosure, with a layer of film (not shown) being below the dielectric fluid contained within the enclosure. In one embodiment, the dielectric fluid is Isopar® M, manufactured by ExxonMobil Chemical Company of Spring, Texas, though other dielectric fluids are also possible. The dielectric fluid can include one or more additives, such as with di-2-ethylhexylsulfosuccinate (AOT) charge director molecules, though other additives are also possible. The objects 11 can be made out of aluminium oxide (AlOx), though other materials are possible. In the description below, the objects 11 are referred to as chiplets 11, though other ways to name the objects 11 are possible. In one embodiment, the film can be a 50 μm thick perfluroalkoxy (PFA) film, though other kinds of film of other thicknesses are possible.

Below the suspended chiplets 11 are a plurality of electrodes 12 forming an array 35, the electrodes configured to generate a dynamic potential energy landscape for manipulating objects with both dielectrophoretic ("DEP") and electrophoretic ("EP") forces. The film is laminated on the electrodes 12. In one embodiment, the electrodes can be square shapes and made off copper, though other shapes and materials are also possible. In one embodiment, the dimensions of a square electrode 12 can be a 16 μm width and 100 nm thickness, though other dimensions are also possible in a further embodiment. The array 35 can include multiple rows of the electrodes 12, with each row including multiple electrodes 12.

The electric potentials generated by the electrodes 12 are controlled by array 13 of photo-transistors, the array including an active-matrix photo-transistor backplane that is set on glass. The multiple photo-transistors on the backplane form the array 13, with each of the photo-transistors in the array 13 being in control of the electric potentials generated by a single electrode 12. In particular, each of the photo-transistors in the array 13 is attached to one electrode 12. The array 13 of phototransistors can have additional characteristics, such as those described in Rupp et al., "Chiplet micro-assembly printer," 2019 *IEEE 69th Electronic Components and Technology Conference (ECTC)*, pages 1312-1315, May 2019, the disclosure of which is incorporated by reference.

Figure 2:
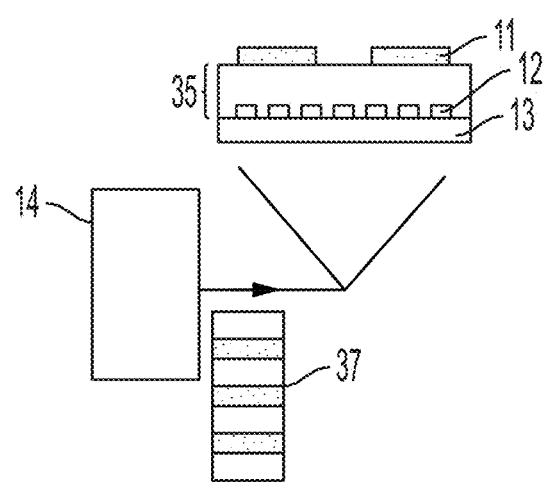
FIG. 2 is a diagram illustrating interactions between the video projector and the photo-transistor array of FIG. 1 in accordance with one embodiment.

The array 13 is optically addressed by a video projector 14 to enable dynamic control of the electrostatic energy potential and manipulation of the positions of multiple chiplets 11 at the same time. In particular, the video projector 14 is used to address each photo-transistor controlled electrode 12, as illustrated by FIG. 2, allowing for facile zoom factor changes and stitching into larger arrays. FIG. 2 is a diagram illustrating interactions between the video projector 14 and the photo-transistor array 13 of FIG. 1 in accordance with one embodiment. The video projector 14 actuates the electrodes 12 by projecting pre-defined patterns: images 37 that are generated based on control inputs: the electric potentials to be generated by the electrodes to achieve desired motion of the chiplets 11, as further described below. The pixelated light projected by the projector 14 that makes up the images charges each individual phototransistor 13 in the array to the degree necessary so that the electrode 12 charged by that phototransistor produces the desired electric potential.

Figure 3A:
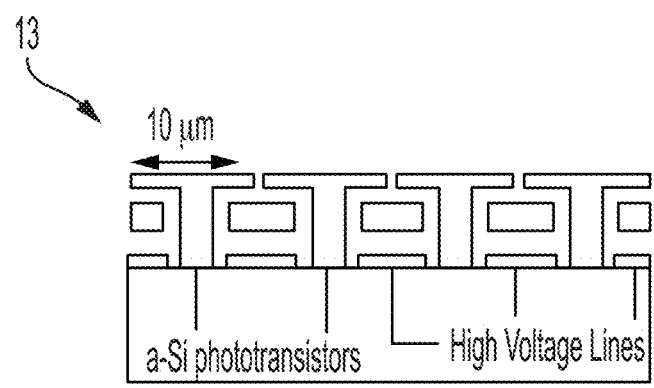
FIGS. 3A-3C show several views of an example of a photo-transistor array of FIG. 1 in accordance with one embodiment.
Figure 3B:
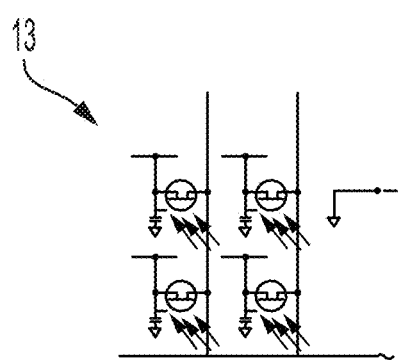
Figure 3C:
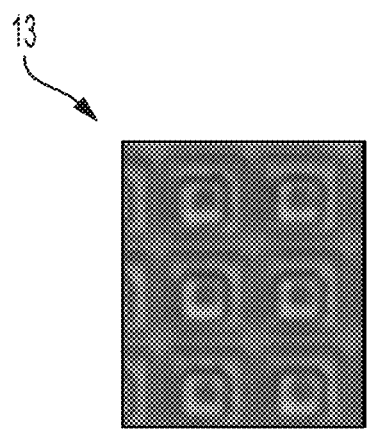

FIGS. 3(A)-3(C) show several views of an example of a photo-transistor array 13 of FIG. 1 in accordance with one embodiment. The photo-transistor array 13 shown with reference to FIGS. 3(A)-3(B) was built using a fabrication techniques similar to those used for building display transistor backplanes, making the fabrication techniques thus compatible with large areas (measuring meters). Voltages of up to +/−200V are controlled by these photo-transistors to display a dynamically varying complicated electric potential landscape. A single voltage signal is synchronized with optical addressing to charge storage capacitors on each pixel. Dynamic electric field patterns are generated by refreshing the projected image pattern (control input). The array 13 with 50 µm, 10 µm and even 3 µm pitch has been built, with pitch being distance between centers of the electrodes to which the phototransistors are attached. Dielectric fluid media (isopar M) and various additives are used to control the charge.

Figure 4A:
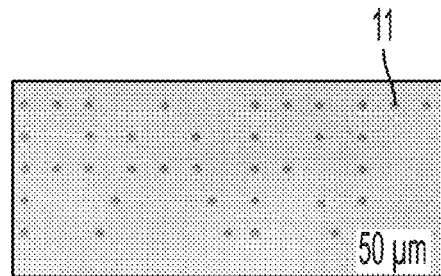
FIGS. 4(A)-4(B) are examples of chiplet patterns realized using the system of FIG. 1.
Figure 4B:
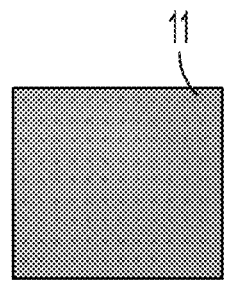

Returning to FIG. 1, the system further includes a high speed camera 15 that tracks locations of the chiplets 11 being moved. Both the video projector 14 and the camera 15 are interfaced to one or more computing devices 16, which can control the electrodes 12 through the projector 14 to induce a formation of a desired chiplet 11 pattern. FIGS. 4(A)-4(B) are examples of chiplet 11 patterns realized using the system of FIG. 1. Other chiplet 11 patterns are also possible.

The connections between the one or more computing devices 16 can be direct, such as a via wires or a wireless connection to physically proximate one or more computing devices 16, or the connection can be via an Internetwork to physically remote one or more computing devices 16, such as via the Internet or a cellular network. The one or more computing devices 16 include a plurality of computer processors that are specialized to perform data processing in parallel. In one embodiment, the computer processors can be graphics processing unit (GPU). In a further embodiment, the computer processors can be tensor processing units (TPUs), developed by Google, LLC of Mountain View, California, which are particularly specialized for neural network machine learning. In a still further embodiment, the computer processors can include both GPUs and TPUs. In a still further embodiment, the computer processors can include other types of processors specialized for parallel processing.

While the one or more computing devices 16 are shown as a server, other types of computer devices are possible. The computing devices 16 can include one or more modules for carrying out the embodiments disclosed herein. The modules can be implemented as a computer program or procedure written as source code in a conventional programming language and is presented for execution by the processors as object or byte code. Alternatively, the modules could also be implemented in hardware, either as integrated circuitry or burned into read-only memory components, and each of the computing devices 16 can act as a specialized computer. For instance, when the modules are implemented as hardware, that particular hardware is specialized to perform the computations and communication described above and other computers cannot be used. Additionally, when the modules are burned into read-only memory components, the computer storing the read-only memory becomes specialized to perform the operations described above that other computers cannot. The various implementations of the source code and object and byte codes can be held on a computer-readable storage medium, such as a floppy disk, hard drive, digital video disk (DVD), random access memory (RAM), read-only memory (ROM) and similar storage mediums. Other types of modules and module functions are possible, as well as other physical hardware components. For example, the computing device 16 can include other components found in programmable computing devices, such as input/output ports, network interfaces, and non-volatile storage, although other components are possible. In the embodiment where the computing devices 16 are servers, the server can also be cloud-based or be dedicated servers.

The one or more computing devices 16 are interfaced to a storage 17 and execute a capacity modeler 18 that obtains parameters 19 of the system, stores the parameters 19 in the storage 17, and models capacitance between the electrodes 12 and the chiplets 11 as well as between the chiplets 11 themselves. The parameters 19 can include the diameter of the chiplets 11, the dimensions of the electrodes 12, the dielectric fluid constant (e.g. as $\varepsilon=2$), the fixed positions of the electrodes 12, material of the chiplets 11 and electrodes 12, and the vertical distance between the chiplets 11 and the electrodes 12 ("height" of the chiplets 11). Other parameters 19 are still possible.

Figure 5:
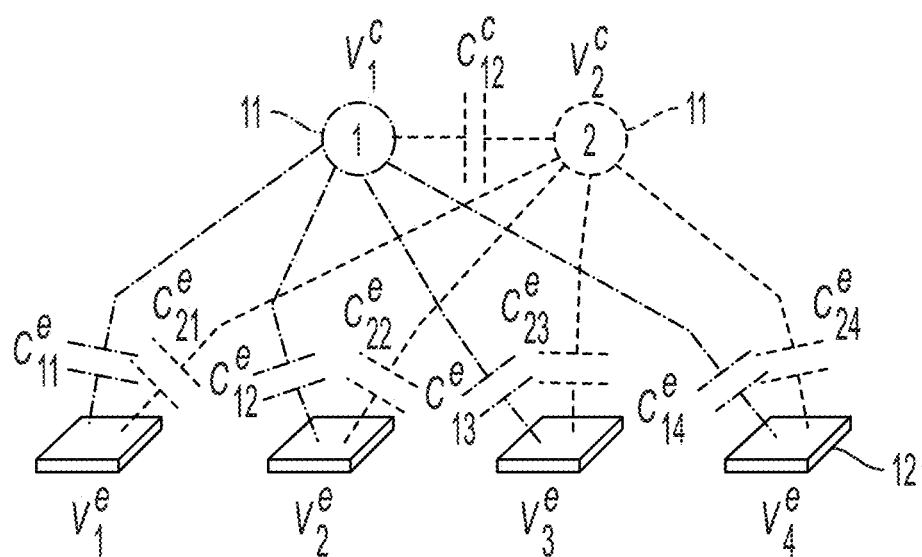
FIG. 5 is diagram illustrating capacitive-based interactions between two chiplets and four electrodes of the system of FIG. 1 in accordance with one embodiment.

The capacity modeler 18 creates a 2D model 20 for the motion of the chiplets 11 under the effect of the potential field induced by the electrodes 12 in the array. This model 20 accounts for possible interactions when the objects 11 get close to each other, and includes a function 31 describing capacitance between an electrode 12 and a chiplet 11 as a function of distance between the electrode 12 and the chiplet, and also includes and a function 32 describing capacitance between two chiplets as a function of a distance between those chiplets, as described below. The model 20 considers a set of n objects 11 actuated by array of m electrodes 12 with fixed positions. The result of applying electric potentials by the phototransistors to the electrodes 12 is the generation of dielectrophoretic forces that act on the chiplets 11. A viscous drag force proportional to the velocity opposes the chiplets' 11 motion, with the drag force being proportional to the velocity in non-turbulent flows, that is, when the Reynolds number is small. Due to the negligible mass of the chiplets 11, acceleration is ignored in the model 20. In the model 20, $x_i=(x_{i,1}, x_{i,2})$ denotes the 2D position of the $i^{th}$ chiplet, and $x=[x_1, \ldots, x_n]$ denotes the ensemble of all of the chiplets' 11 positions. In addition, $y_i$ denotes the fixed position of $i^{th}$ electrode 12. The dynamical model 20 for the $i^{th}$ chiplet model can be described by:

$$\mu \dot{x}_i = F_i(x) \qquad (1)$$

where $\mu$ is the fluid dependent viscous coefficient, and $F_i(x)$ is the two dimensional force vector induced by the potential field. The forces acting on the chiplets 11 are determined by the potential energy accumulated by the chiplets 11. The capacity modeler 18 determines the potential energy by using a capacitive-based electrical circuit that lumps the interaction between the electrodes 12 and the objects 11. Such a circuit is shown in FIG. 5. FIG. 5 is diagram illustrating capacitive-based interactions between two chiplets 11 and four electrodes 12 of the system of FIG. 1 in accordance with one embodiment. The four electrodes 12 have potentials $V_i$, $i \in \{1,2,3,4\}$. Two chiplets 11 interact with the electrodes 12 through capacitances $C_{ij}^e$, where i is the chiplet index and j is the electrode index. The two chiplets interact through the capacitance $C_{12}^c$. While in FIG. 5 only one row with four electrodes 12 of the array is depicted, the array can have multiple rows of electrodes 12 with other numbers of electrodes 12, allowing for easy scalability of the system.

The capacitance-based abstraction comes from the observation that the chiplets 11 and the electrodes 12 act as metal plates when a fluid with dielectric properties is placed between them; hence the capacitances of these capacitors are dependent on the relative positions between chiplets 11, and between chiplets 11 and electrodes 12. As expected, the maximum values are attained when chiplets 11 are close to other chiplets 11 or electrodes 12. To simplify the analysis, the model 20 is limited to low frequency region only, where the dielectric constant is not frequency dependent.

The potential energy U (x) in the system can be expressed in terms of the capacitances between the chiplets 11 and electrodes 12 as follows:

$$U(x) = \frac{1}{2}\sum_{i,j,i<j} C_{ij}^c(x_i - x_j)(V_i^c - V_j^c)^2 + \frac{1}{2}\sum_{i,j} C_{ij}^e(x_i - y_j)(V_i^c - V_j^e)^2, \quad (2)$$

where $V^c=[V_1^c, \ldots, V_n^c]$, $V^e=[V_1^e, \ldots, V_m^e]$ are the electric potentials at the chiplets and electrode respectively, and where $C_{ij}^c(x_i-x_j)$ and $C_{ij}^e(x_i-y_j)$ are the chiplet to chiplet 11 capacitances, and chiplet 11 to electrode 12 capacitances, respectively. In the potential energy expression, the model 20 ignores the electrophoretic effects found negligible. The chiplet potential vector $V^c$ is a function of the relative postilions as well, since the vector is computed as the steady state solution of the general form of the electric circuit shown with reference to FIG. 5. The chiplet 11 potentials can be computed by solving the following set of coupled equations:

$$\sum_{i,j,i\neq j} C_{ij}^c(V_j^c - V_i^c) + \sum_{i,j} C_{ij}^e(V_j^e - V_i^c) = 0, \forall\, i \in 1, 2, \ldots, n. \quad (3)$$

The previous set of equations can be compactly written as $$C^c(x)V^c + C^e(x)V^e = 0, \quad (4)$$

where the matrices $C^c \in R^{n\times n}$ and $C^e \in R^{n\times m}$ and their $i^{th}$ rows cat be expressed as:

$$[C^c]_i = \left[C_{i1}^c, \ldots C_{i,j-1}^c, -\sum_{i,j,i\neq j} C_{ij}^c - \sum_{i,j} C_{ij}^e, C_{i,j+1}^c, C_{i,j+1}^c, \ldots, C_{i,n}^c\right],$$

$$[C^e]_i = [C_{i1}^e, C_{i2}^e \ldots C_{i,m}^e].$$

Hence, $V^c=-[C^c(x)]^{-1}C^e(x)V^e$.

The forces $F_i(x)$ can be expressed in terms of the potential energy $U(x)$ and are given by $$F_i(x) = -\frac{\partial U}{\partial x_i}(x),$$

where $$\frac{\partial U}{\partial x_i}$$

is a two dimensional, vector valued function. Therefore, the chiplets 11 dynamics can be expressed as $$\mu \dot{x}_i = -\frac{\partial U}{\partial x_i}(x). \quad (5)$$

Feedback control design requires explicit expressions for the capacitances between the chiplet and electrodes. The capacitance modeler 18 creates the model 20 using high fidelity simulations using the COMSOL Multiphysics© software developed by COMSOL, Inc. of Burlington, MA ("COMSOL"), though other kinds of simulations using other kinds of software are also possible. For symmetric chiplets 11 (e.g., beads) assuming the electrodes 12 are symmetric also, the capacitances of model 20 between chiplets 11 and electrodes 12 are estimated by simulating a 2-dimensional electrostatic COMSOL model. This implies that the capacitance function is of the form $C_{ij}^e(x_i-x_j)=C(\|x_i-y_j\|)$, where $x_i-y_j$ denotes the distance between chiplet i and electrode j.

Figure 6:
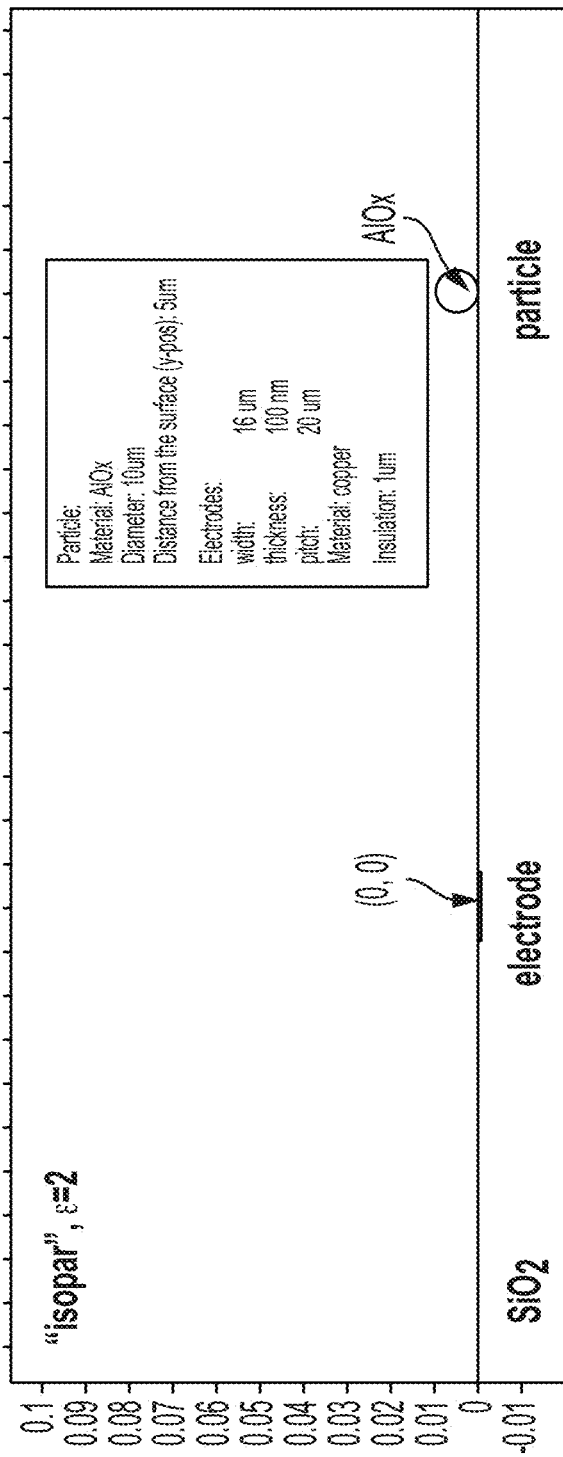
FIG. 6 is a diagram showing the COMSOL model of two conductors (spherical chiplet and an electrode) for capacitance computation in accordance with one embodiment.

FIG. 6 is a diagram showing the COMSOL model of two conductors (spherical chiplet 11 and an electrode 12) for capacitance computation in accordance with one embodiment. The electrode's 12 position is (0,0). In the COMSOL model shown with reference to FIG. 6, a 16 μm width and 100 nm thickness copper plate (acting as an electrode 12), and a 10 μm diameter, aluminium oxide (AlOx) spherical object are surrounded by a dielectric fluid with the same properties as the Isopar-M solution mentioned above.

The quasi-static models are computed in a form of electromagnetic simulations using partial differential equations, where the capacity modeler 18 uses ground boundary (zero potential) as the boundary condition of the model design. The capacitance matrix entries are computed from the charges that result on each conductor when an electric potential is applied to one of them and the other is set to ground. The COMSOL simulations do reflect the field distortion when the chiplet 11 approaches the electrode 12. The COMSOL electrostatic model used the following parameters 19: the diameter of the chiplets 11, the electrode 12 dimensions, the dielectric fluid constant (ε=2) and the positions and material of the sphere and electrode. The chiplet 11 height is set at (z=5 μm) and the chiplet position on the x-axis is varied over the interval [−1 mm, 1 mm], though in a further embodiment, other positions are possible. Due to the size of the chiplet 11 versus the size of the electrodes 12, fringe effects (electric field distortions at the edges) are significant.

The capacitance modeler 18 performs off-line COMSOL simulations for a range of chiplet positions at a constant height. Continuing with the current example, the range of chiplet positions and the height respectively are: x∈ [−1 mm, 1 mm] and z=5 μm. The capacitances between the electrode 12 and the chiplet are evaluated for all considered positions. The capacity modeler 18 parameterizes the capacitance function using error functions:

$$C(\xi) = \sum_{i=1}^{m} a_i\left[\Phi\left(\frac{\xi+\delta}{c_i}\right) - \Phi\left(\frac{\xi-\delta}{c_i}\right)\right],$$

where $C(\xi)$ is the capacitance function, $$\Phi(\xi) = \frac{1}{\sqrt{\pi}}\int_{-\xi}^{\xi} e^{-t^2} dt$$

is the error function, $\xi$ is the distance between the center of the sphere and the electrode center assumed at the origin, $a_i$ and $c_i>0$ are positive scalars, and $\delta$ is half of the electrode pitch, i.e., 10 μm in the current example, though other values are also possible in a further embodiment.

Figure 7:
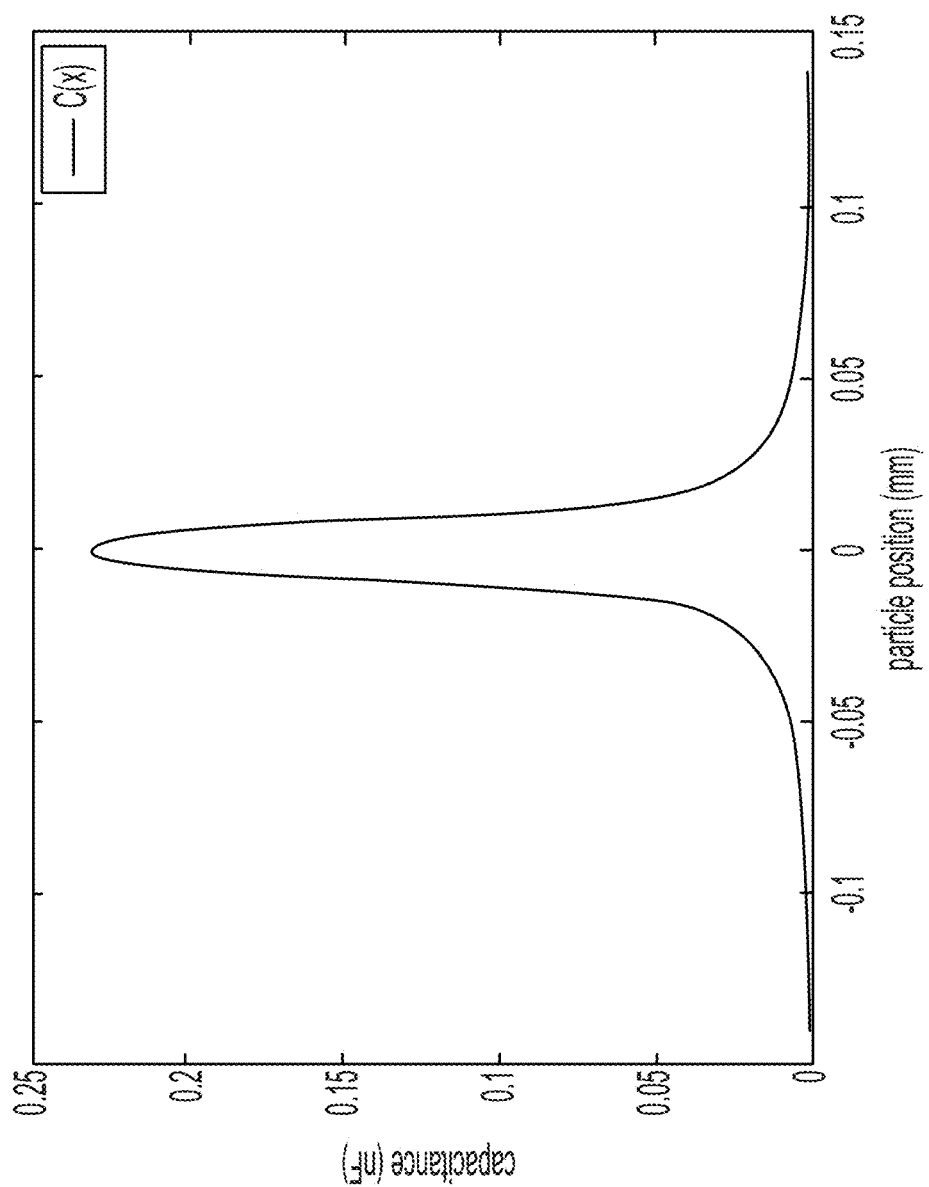
FIG. 7 shows the capacitance function fitted with training data generated by COMSOL simulations in accordance with one embodiment.

FIG. 7 shows the capacitance function fitted with training data generated by COMSOL simulations in accordance with one embodiment. FIG. 7 depicts $C(\xi)$, the capacitance between the chiplet and the electrode as a function of the chiplet horizontal position, where the numerical values were fitted on the error function parameterization. The capacitance modeler 18 can map the 1D model to a 2D model by using the transformation $\xi \to \sqrt{x^2+y^2}$, which results in a capacitance function 31:

$$C(x, y) = \sum_{i=1}^{m} a_i \left[ \Phi\left(\frac{\sqrt{x^2+y^2}+\delta}{c_i}\right) - \Phi\left(\frac{\sqrt{x^2+y^2}-\delta}{c_i}\right) \right].$$

Figure 8:
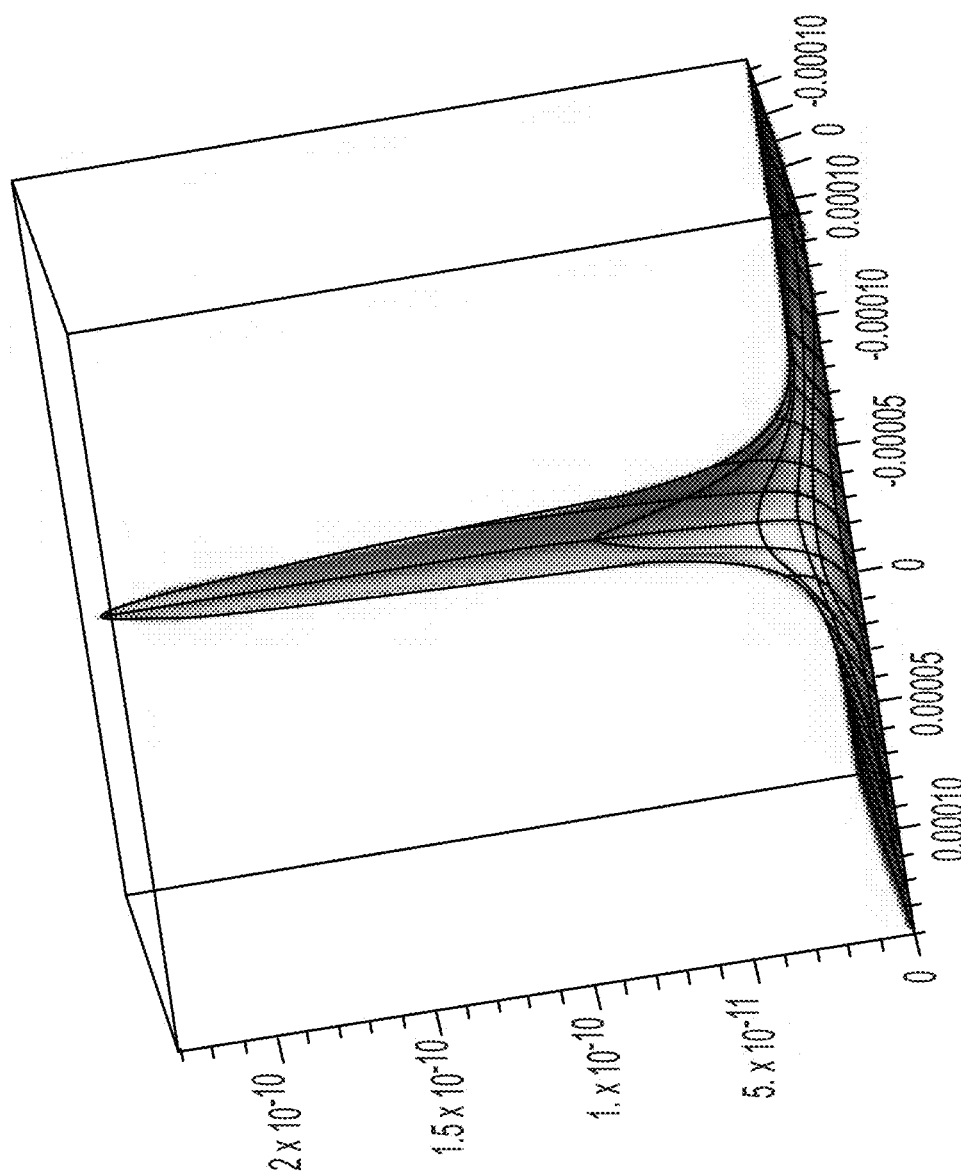
FIG. 8 is a diagram showing 2D capacitance function determined from the 1D model using the symmetry property in accordance with one embodiment.

For the sphere shape chiplet 11, considering only one term in the parameterization of the capacitance function, and the resulting 2D shape is depicted in FIG. 8. FIG. 8 is a diagram showing 2D capacitance function determined from the 1D model using the symmetry property in accordance with one embodiment.

The capacity modeler 18 similarly determines a capacitance function 32 describing the dependence between the capacitance between two chiplets 11 and the distance between those chiplets 11. The function 32 can be expressed as:

$$C(x, y) = \sum_{i=1}^{m} a_i \left[ \Phi\left(\frac{\sqrt{x^2+y^2}+\delta}{c_i}\right) - \Phi\left(\frac{\sqrt{x^2+y^2}-\delta}{c_i}\right) \right]$$

whose structure is similar to the capacitances between chiplets and electrodes. The specific parameters of the formulat though ($a_i$, $c_i$) may be different and are learned from another set of COMSOL simulations.

The one or more computing devices 16 further execute a position tracker 36 that analyzes the images 21 captured by the high-speed camera 15 to determine the positions 22 of the chiplets 11. The positions 22 and the capacitance model 20 are used to determine a control scheme 24, which includes the trajectories 38 of the chiplets 11 necessary to get them to desired positions 23 and control inputs 27 (the electric potentials) that need to be generated by the electrodes 12 induce the electrodes to move along the desired trajectories. The determination is performed using model predictive control ("MPC") optimization by an MPC optimizer 25 executed by the one or more computing devices 16. As described in Camponogara et al., "Distributed model predictive control," *Control Systems, IEEE*, 22(1):44-52, February 2002, and Garcia et al., "Model predictive control: Theory and practice—A survey," *Automatica*, 25(3):335-348, 1989, the disclosures of which are incorporated by reference, MPC is the go to approach for control of nonlinear systems and is based on solving a nonlinear program with constraints. The optimization variables are the state trajectories 38 (trajectories to be followed by the chiplets 11) and control inputs 27 (which are images to be projected by the projector 14 to the photo-transistors in the array that result in the electric potentials to be generated by the electrodes 12) over time.

The MPC optimization is performed using constraint 26 set by the MPC optimizer 25 based on user input, with the most important constraint 26 being the system dynamics constraint that makes sure that the state trajectory respects the system dynamics. Other constraints 26 can include setting the initial and final values of the state variables (initial and final positions of the objects 11), or limiting the magnitude of the states (limiting how far the chiplets 11 can move) and control inputs (limiting the magnitude of potentials that are generated by the electrodes 12). The control objective is to bring a set of chiplets 11 from some arbitrary initial condition to a desired final chiplet 11 configuration 23, which can be received from a user. The MPC formulation assumes a discretization of the time domain $\mathcal{T} = \{t_0, t_1, \ldots, t_N\}$ and the optimization variables are the state and control values at discrete time instants, that is, $x(t_k)$ and $V^e(t_k)$, for $k \in \{0,1,\ldots,N\}$. The key step in the formulation of the system dynamics constraint is the representation of the time derivatives $\bar{x}(t_k)$. Approaches based on trapezoidal collocation or Hermite-Simpson collocation, such as described by Matthew Kelly, "An introduction to trajectory optimization: How to do your own direct collocation," *SIAM Review*, 59(4):849-904, 2017, the disclosure of which is incorporated by reference, are used to transform the continuous dynamics into a discrete set of equality constraints. Such approaches basically locally approximate the state and input trajectory while imposing equality constraints at the collocation points. The MPC optimizer 25 uses a different approach to solve the MPC problem: the MPC optimizer 25 uses a global representation of the state and input trajectories and uses automatic differentiation to compute time derivatives. Automatic differentiation is useful beyond computing time derivative. The system dynamics is based on computing partial derivatives of the energy function given by Equation (2) above. Evaluating such derivative is particularly difficult due to the matrix inversion step when computing the chiplet potentials $V^C$. An additional advantage of automatic differentiation is the ability to compute gradients and Jacobian matrices for the loss and constraint functions described below.

In the MPC formulation, the MPC optimizer 25 represents the state and input trajectories as smooth functions. The input trajectory is a function of space as well, since the electrode potential are computed at particular positions. Hence there are two functions x: $R \to R^{2n}$ and $V^e$: $R \times R^2 \to R$ that depend on a set of unknown parameters, that is, $x(t)=x(t; w_x)$ and $V^e(t, y)=V^e(t, y; w_y)$. This particular representation of the electrode potential has the advantage that the formulation does not require to consider each electrode potential as a separate input. Hence, the MPC optimizer 25 can scale up the approach with the number of electrodes.

Let $w=[w_x, w_v]$ be the combined parameters of the state and control input representations, with volts being units of control inputs. The MPC formulation takes the following form:

$$\min_w \frac{1}{2} \|w\|^2 \tag{6}$$

$$\text{subject to: } \dot{x}(t; w) = -\frac{1}{\mu} \frac{\partial U}{\partial x}(x(t; w), V^c(t; w)), \forall t, \tag{7}$$

$$V^c(t; w) = -[C^c(x)]^{-1} C^e(x) V^e(t, y; w), \tag{8}$$

$$x(t_0) = x_0, \tag{9}$$

$$x(t_N) = x_N, \tag{10}$$

$$|V^e(t, y; w)| \leq V_{max}, \forall t, y. \tag{11}$$

The loss function described by equation (6) controls the magnitude of the parameters of the state and input parameterizations, equation (7) imposes the system dynamics constraint, equation (8) connects the chiplet potentials to the electrode potentials, equations (9)-(10) enforce the initial condition and the final desired condition, respectively, while equation (11) limits the magnitude of the electrode potentials to physically realizable values. In any practical implementation, the MPC optimizer discretizes the time domain, and therefore the optimization formulation is expressed as $$\min_w \frac{1}{2}\|w\|^2 \tag{12}$$

$$\text{subject to: } \dot{x}(t_k; w) = -\frac{1}{\mu}\frac{\partial U}{\partial x}(x(t_k; w), V^c(t_k; w)), \forall\, t_k \in \mathcal{T}, \tag{13}$$

$$V^c(t_k; w) = -[C^c(x(t_k))]^{-1} C^e(x(t_k)) V^e(t_k, y; w), \tag{14}$$

$$x(t_0) = x_0, \tag{15}$$

$$x(t_N) = x_N, \tag{16}$$

$$|V^e(t_k, y; w)| \le V_{max}, \forall\, j, \forall\, t_k \in \mathcal{T}, \forall\, y. \tag{17}$$

Note that due to the parameterization of the state and input, the MPC optimizer 25 is not dependent on a particular discretization scheme. In fact, during the optimization procedure, the MPC optimizer 25 can randomly select time instants from the time domain. In turn, this approach will reduce overfitting of the optimization solution to a particular time discretization scheme. The MPC optimizer 25 fixes the space discretization for the control input since electrodes are at fixed position, and what happens between electrode positions does not necessarily matter for the analysis by the MPC optimizer 25, with no separate capacitance that needs to be taken into account taking place between two neighboring electrodes. The optimization solution parameterization has the same flavor as the PDE solution parameterizations studied by Al-Aradi et al., "Solving nonlinear and high-dimensional partial differential equations via deep learning, 2018," the disclosure of which is incorporated by reference. In one embodiment, a constrained optimization formulation is used that strictly enforces the equality constraints to avoid the painful exercise of properly scaling the different components of the loss function in case we add the constraints in the loss functions. In a further embodiment, other constrained optimization formulations are possible.

To solve the nonlinear program with constraints (12)-(17), the MPC optimizer 25 must choose parameterizations for the state and input representations. In principle, the MPC optimizer 25 can choose any smooth parameterizations, rich enough to represent the trajectories. However, the MPC 25 optimizer uses a neural network representation for practical reasons: their evaluation can be done efficiently when using implementations on specialized processors working in parallel, such as GPUs or TPUs. In other words, the MPC optimizer 25 can evaluate efficiently the state, state derivatives and inputs by passing all time samples simultaneously through the processors doing parallel data processing. When choosing the optimization algorithm, the MPC optimizer 25 takes advantage of the fact that the MPC optimizer 25 can use again automatic differentiation to compute gradients and Jacobian matrices of the loss and constrain functions. One algorithm for nonlinear programming that proves to be efficient in practical implementations and makes heavy use of gradients and Jacobian matrices is the sequential quadratic programming (SQP) algorithm, such as described Nocedal et al., "Numerical Optimization," Springer, New York, NY, USA, second edition, 2006, the disclosure of which is incorporated by reference. SQP solves a sequence of quadratic, convex optimization problems with equality constraints. Automatic differentiation deals with the linearization difficulties that sometimes plague the SQP algorithm. The SQP algorithm uses second order information (e.g., Hessian matrix) of the loss function that can add additional complexities for large scale problems. The MPC optimizer 25 avoids this potential complexity by having a simple L2 norm cost, which has a constant Hessian matrix. For evaluating gradients and Jacobian matrices, the MPC optimizer 25 can use Jax Python framework ("JAX"), as described by James Bradbury, Roy Frostig, Peter Hawkins, Matthew James Johnson, Chris Leary, Dougal Maclaurin, and Skye Wanderman-Milne, in "JAX: composable transformations of Python+NumPy programs," 2018, the disclosure of which is incorporated by reference, though other frameworks are also possible. JAX can automatically differentiate native Python and NumPy functions can take execute chained derivatives if needed. JAX can compile and run NumPy programs on GPUs and TPUs, can use just-in-time (JIT) compilation of Python functions for higher execution efficiency and supports automatic vectorization. The latter is particularly useful since it allows batch evaluations of gradient functions. To minimize the number of explicit constraints, the equality constraints can be reformatted to include only one constraint. In particular, equation (13) can be replaced with:

$$\sum_{k=0}^{N}\left[\dot{x}(t_k; w) + \frac{1}{\mu}\frac{\partial U}{\partial x}(x(t_k; w), V^c(t_k; w))\right]^2 = 0. \tag{18}$$

This change results in only one equality constraint enforcing the system dynamics. To avoid chiplet trajectories 38 that lead to chiplets 11 getting in contact, the HMC Optimizer 25 can impose an additional constraint 26 that makes sure chiplets 11 remain at a minimum distance from other chiplets, while moving to their final destination. The inequality constraint 26 that can be described by:

$$\min\{\|x_i - x_j\|, i \ne j\} \ge d, \tag{19}$$

ensures that the distance between any two chiplets is no less than d, where d is a positive scalar chosen based on the chiplets' 11 geometry. The automatic differentiation feature of the JAX framework can deal with min, max operator, so by adding this inequality constraint 26, the MPC optimizer 25 do not add a significant complexity. Hence the optimization problem that the HMC optimizer solves has the final form given by:

$$\min_w \frac{1}{2}\|w\|^2 \tag{20}$$

$$\text{subject to: } \sum_{k=0}^{N}\left[\dot{x}(t_k; w) + \frac{1}{\mu}\frac{\partial U}{\partial x}(x(t_k; w), V^c(t_k; w))\right]^2 = 0 \tag{21}$$

$$x(t_0) = x_0, \tag{22}$$

$$x(t_N) = x_N, \tag{23}$$

$$|V^e(t_k, y_j; w)| \le V_{max}, \forall\, j, \forall\, t_k \in \mathcal{T}, \tag{24}$$

$$\min\{\|x_i - x_j\|, i \ne j\} \ge d. \tag{25}$$

Note that MPC optimizer 25 does not have to explicitly introduce the constraint (14) since the MPC optimizer 25 can directly substitute $V^c(t_k; w)$ with that term's solution.

The control inputs 27 generated by the MPC optimizer are used by a projector controller 28 executed by the one or more computing devices 16 to map the control inputs 27 to the images 37 that are provided to the video projector 14, and which in turn projects the images 37 to the phototransistors controlling the electrodes 11, thus actuating the movement of the chiplets 11. The mapping can be done as described in U.S. Patent Application Publication No. US20200207617, entitled "Micro-assembler system for manipulating micro-objects," to Plochowietz et al., published Jul. 2, 2020, the disclosure of which is incorporated by reference.

Figure 9:
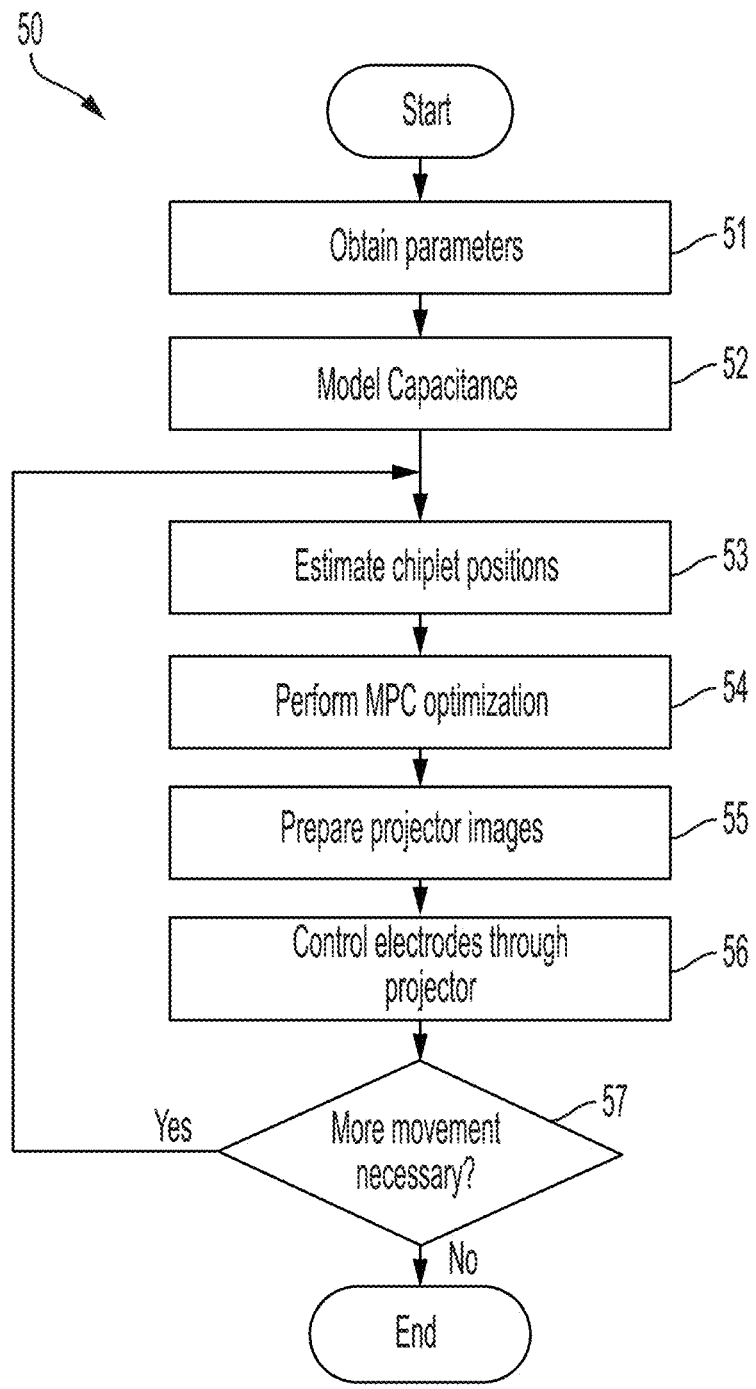
FIG. 9 is a flow diagram showing a method for multi-object micro-assembly control with the aid of a digital computer.

The particular representation of the electrode potential used during the MPC optimization described above has the advantage of not requiring to consider each electrode as a separate input, thus allowing to easily scale the numbers of electrodes used for moving the chiplets to many thousands. FIG. 9 is a flow diagram showing a method 50 for multi-object micro-assembly control with the aid of a digital computer. The method 50 can be performed using the system of FIG. 1. Parameters of the system are obtained, such as diameter of the chiplets, the dimensions of the electrodes, the dielectric fluid constant, the initial positions and material of the chiplets and electrodes (which can be obtained using the high-speed camera), and the height of the chiplets, though other parameters are possible (step 51). A capacitance-based model of the motion of the chiplets is created (step 52), as further described with reference to FIG. 10 and as described above with reference to FIG. 1. MPC optimization of trajectories and control input are performed, as further described above with reference to FIG. 1 and below with reference to FIG. 11 (step 53). The control inputs are mapped to images for display by the video projector (step 54) and electrodes in the electrode array are controlled to induce the movement of the chiplets to desired positions (step 55). Positions of the chiplets are determined following the movement inducted by the electrodes using the high-speed camera as described above (step 56). If the chiplets have arrived at the desired positions (step 57), the method 50 ends. If the chiplets still need to be moved (step 57), the method 50 returns to step 53.

Figure 10:
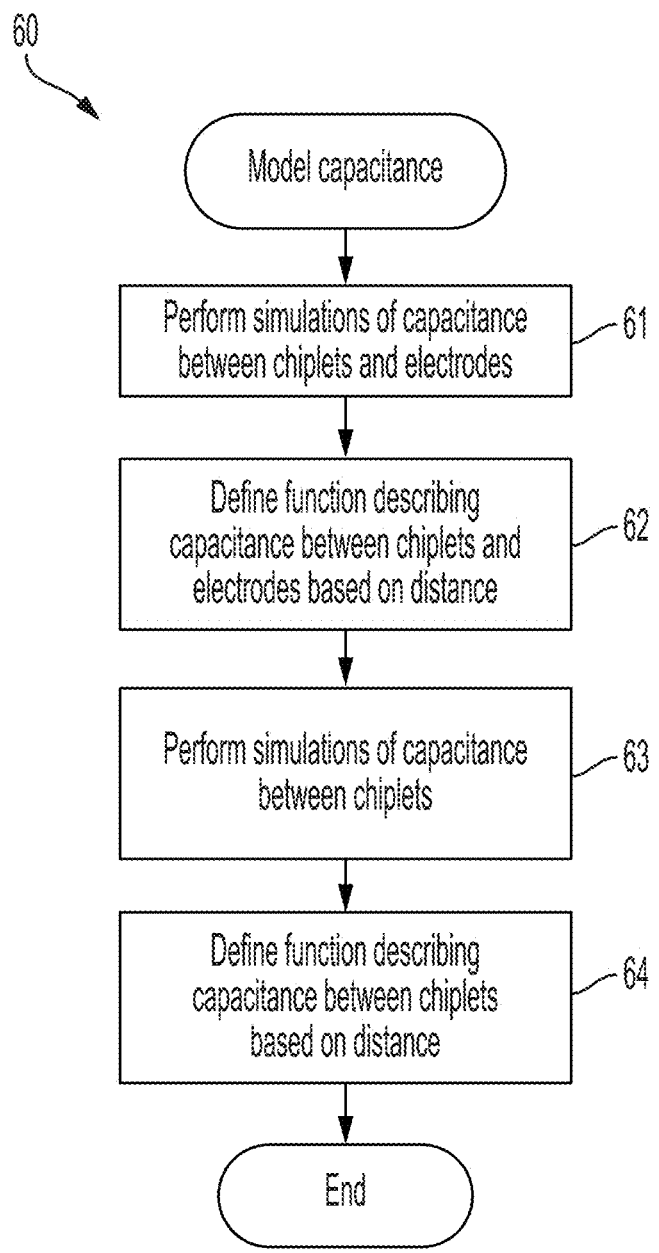
FIG. 10 is a flow diagram showing a routine for modeling chiplet motion based on capacitance for use in the method of FIG. 9 in accordance to one embodiment.

The capacitance-based model of motion of the chiplets accounts both for capacitance between a chiplet and an electrode and a capacitance between two different chiplets. FIG. 10 is a flow diagram showing a routine 60 for modeling chiplet motion based on capacitance for use in the method 50 of FIG. 9 in accordance to one embodiment. Simulations, such as COMSOL simulations, are performed for capacitance between an electrode and a chiplet at multiple distances as described above with reference to FIG. 1 (step 61). A function describing the dependence between the capacitance between an electrode and a chiplet is defined based on the simulations regarding the capacitance between the, as described above with reference to FIG. 1 (step 62). Simulations, such as COMSOL simulations, are performed for capacitance between two chiplets at multiple distances as described above with reference to FIG. 1 (step 63). A function describing the dependence of capacitance between two chiplets is defined based on the simulations regarding the capacitance between the two chiplets, as described above with reference to FIG. 1 (step 64), ending the routine 60.

Figure 11:
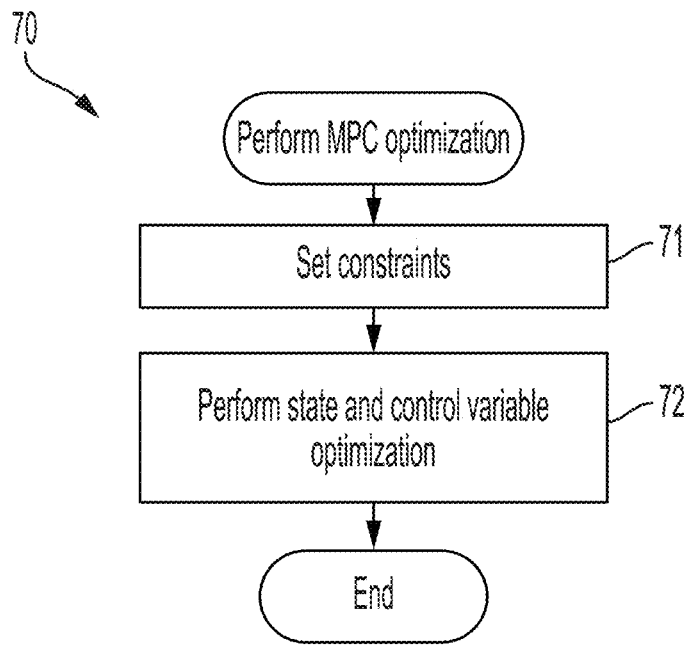
FIG. 11 is a flow diagram showing a routine for performing MPC optimization for use in the method of FIG. 9 in accordance with one embodiment.

MPC optimization uses global parametrizations of the state and control variables over time to derive the trajectories of the chiplets necessary to move the chiplets to desired positions and the electric potentials that the electrodes need to generate to move the chiplets along those trajectories. FIG. 11 is a flow diagram showing a routine 70 for performing MPC optimization for use in the method 50 of FIG. 9 in accordance with one embodiment. Initially, constraints are set, such as the system dynamics constraints and constrains determining the distance that the chiplets must remain from each other, as described above with reference to FIG. 1 (step 71). The optimization of the state and control variables is performed using the constraints, as described above with reference to FIG. 1, ending the routine 70 (step 72).

To demonstrate the effectiveness of the system of FIG. 1 and the method of FIG. 9, two examples of jointly controlling ten chiplets are presented. The first example demonstrates the ability of the system and method to generate control signals and trajectories that bring the chiplets in their desired positions, while keeping a minimum distance between them. In the second example, one chiplet is fixed in a desired position, and control over the remaining nine chiplets is implemented. Control inputs and trajectories that in addition to bringing the chiplets in their desired final positions, keep one of the chiplet in a fixed position are shown. Two types of figures are presented. In the first type of figures, snapshots of the chiplet trajectories over time are presented. In both examples, the electrode array is 5×5, where the units are millimeters. In the second type of figures, color codes show electrode potentials. Grayscale portions of the figures refer to positive values—the darker the grayscale colors in a portion of the figure, the greater the magnitude of the potentials being in that portion of the figure. Stippled portions of the figures refer to negative values—the denser the stippling in a portion of a figure, the larger the potential magnitude in that portion of the figure. The maximum value of the electrode potentials is 400 Volts. The optimization time horizon is 5 seconds, with a sampling period of 0.01 seconds. Therefore, 500 time instants were used during the optimization procedure. The chiplets in both examples were controlled using 400 electrodes uniformly distributed over the 5×5 array.

Figure 12:
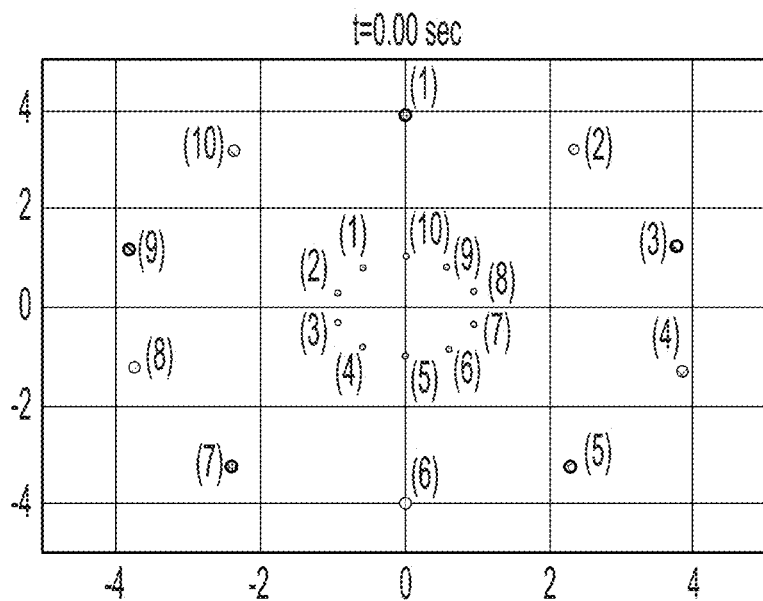
FIG. 12 is a diagram illustrating initial positions and final positions of chiplets of a first example of chiplet movement using the system of FIG. 1 and the method of FIG. 9.
Figure 13A:
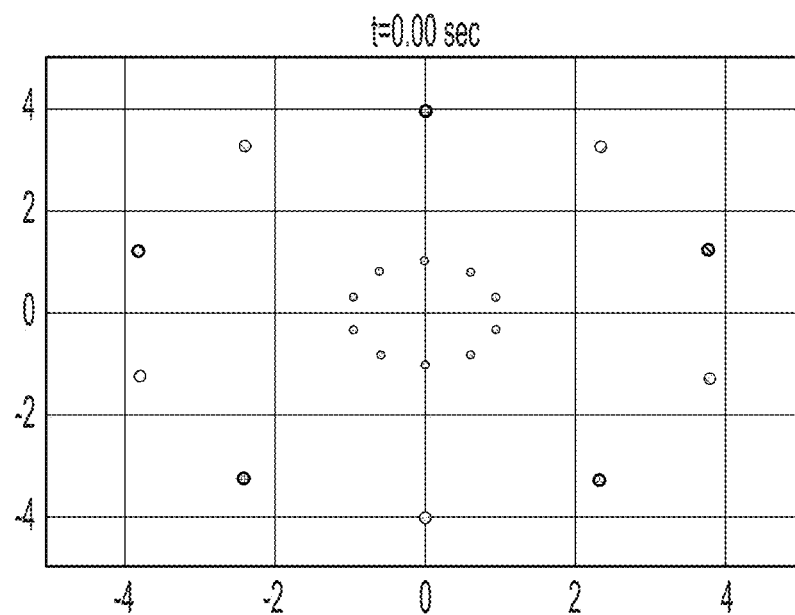
FIGS. 13(A)-13(F) are diagrams showing trajectories of ten chiplets of the first example over time derived using the SQP algorithm.
Figure 13B:
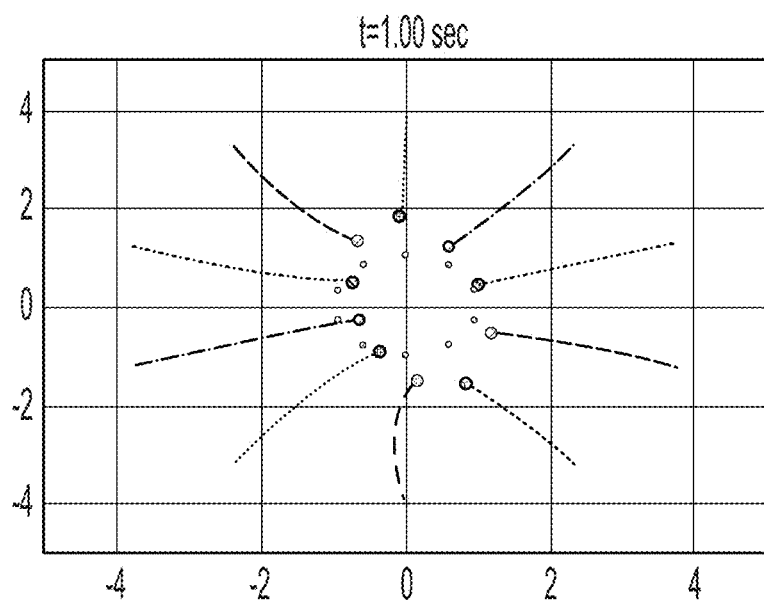
Figure 13C:
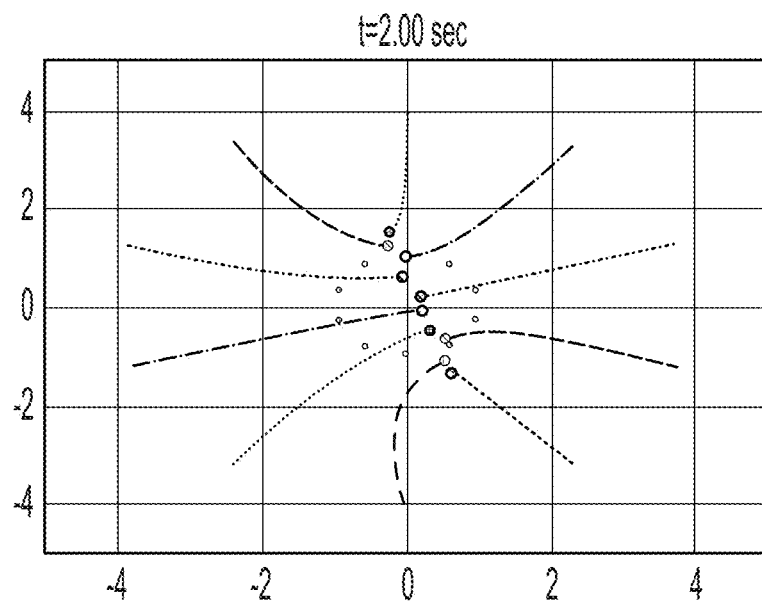
Figure 13D:
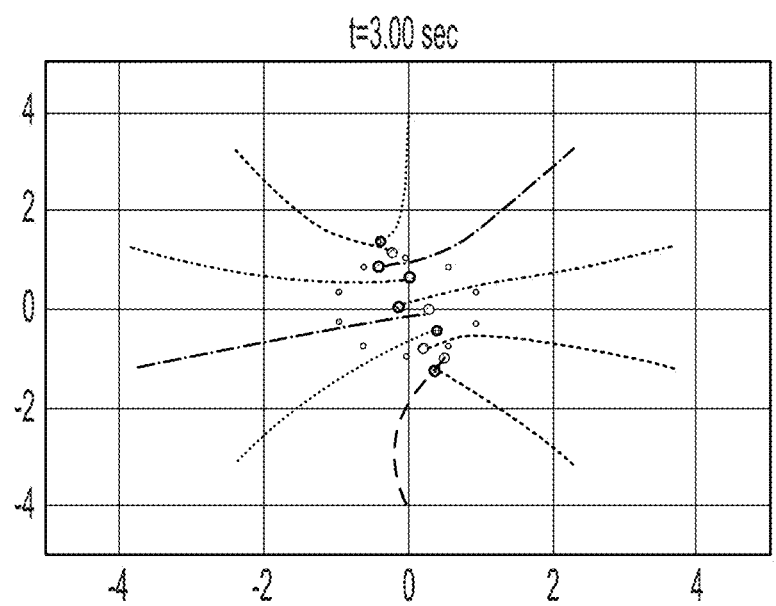
Figure 13E:
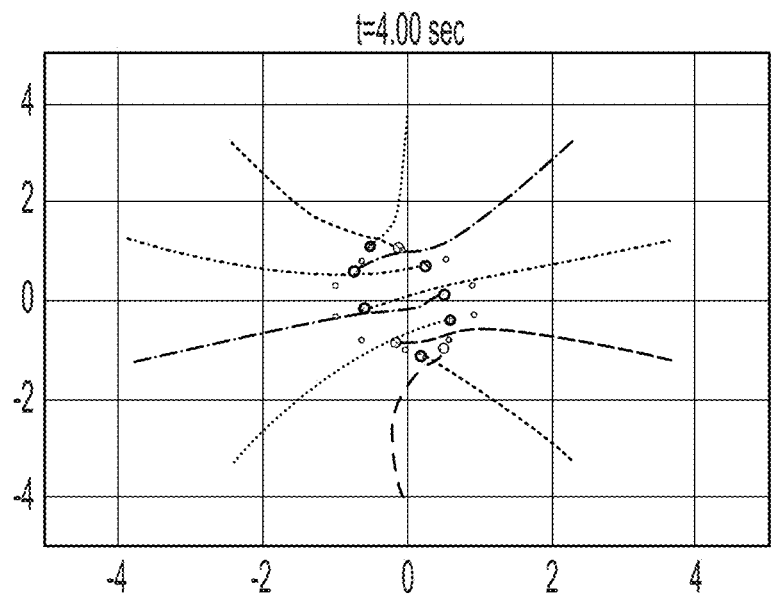
Figure 13F:
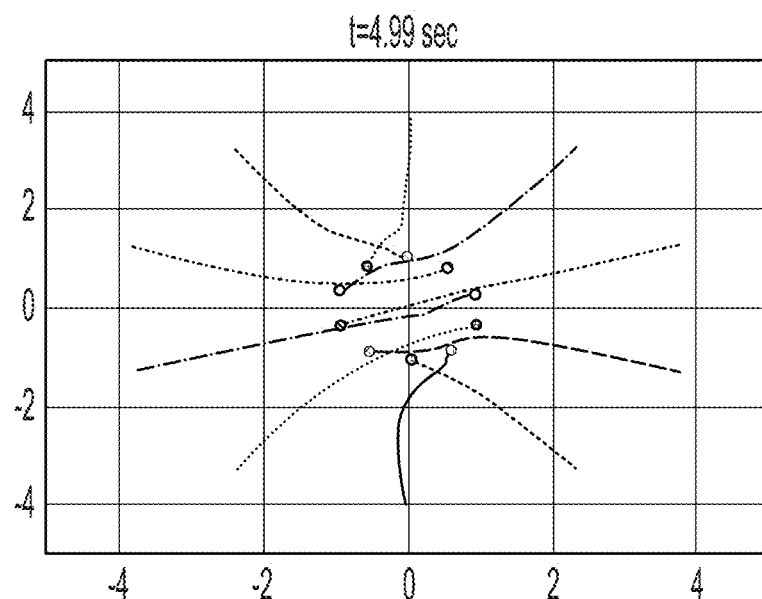
Figure 14A:
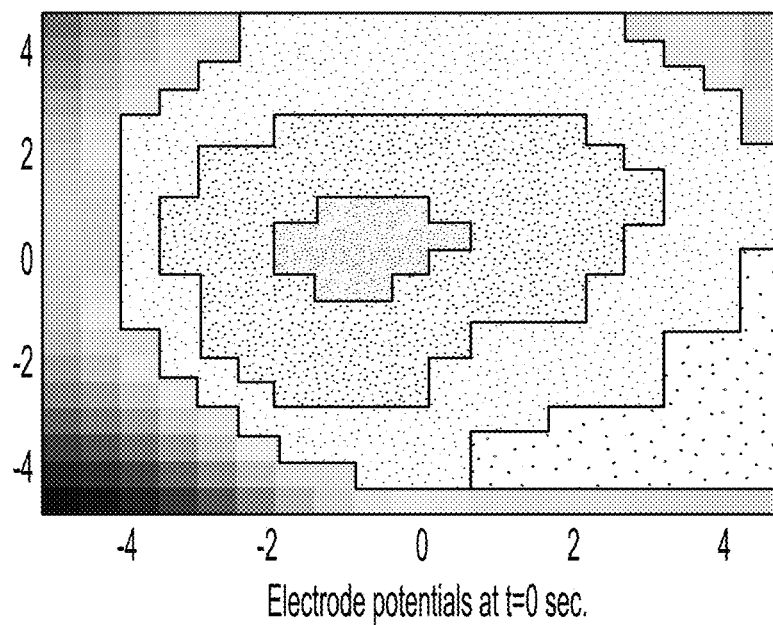
FIGS. 14(A)-14(F) are diagrams showing the electrode potential over time used to move the chiplets whose trajectories are shown with reference to FIGS. 13(A)-13(F).
Figure 14B:
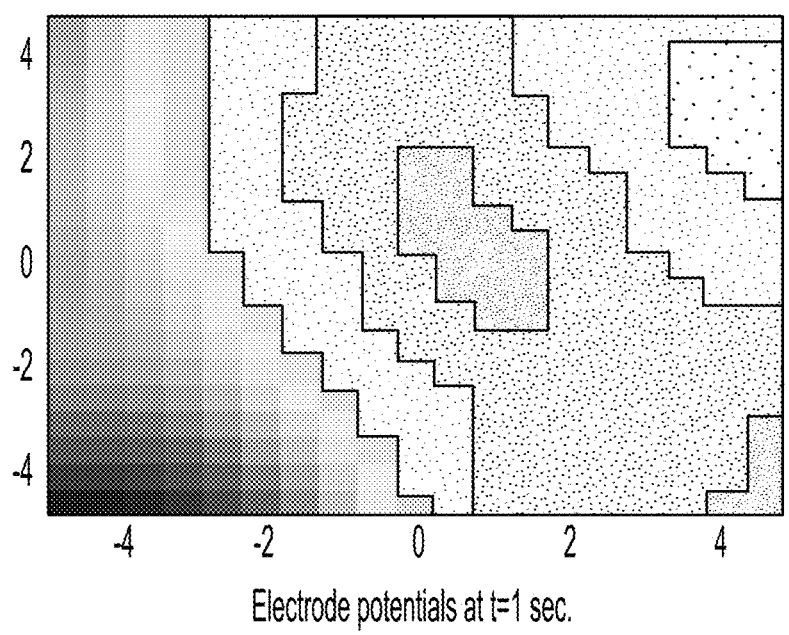
Figure 14C:
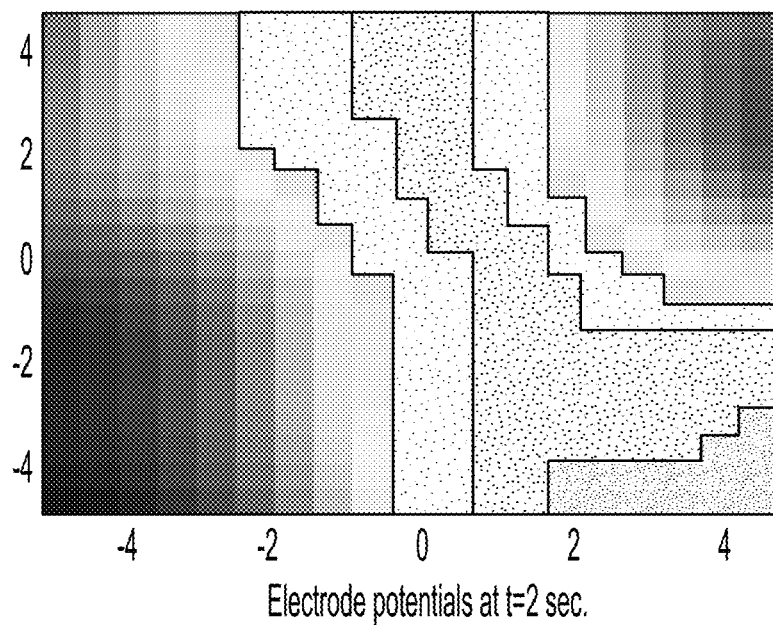
Figure 14D:
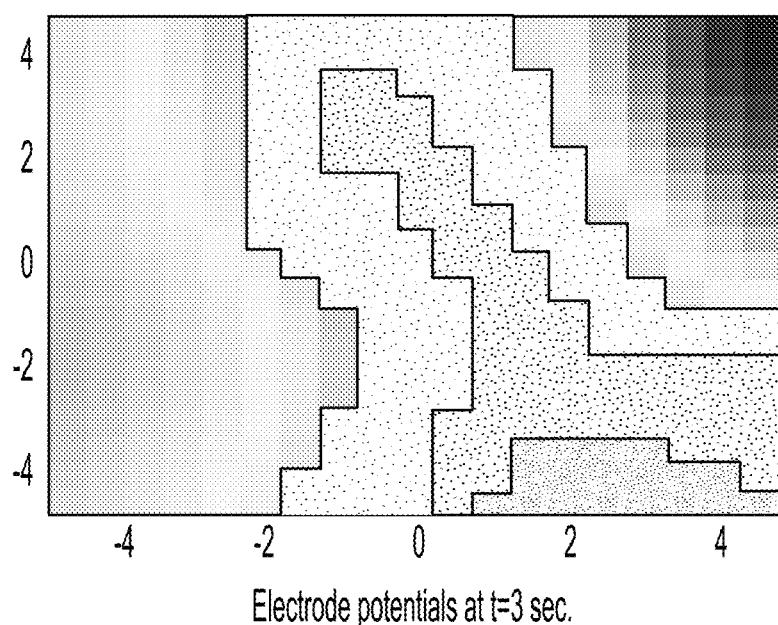
Figure 14E:
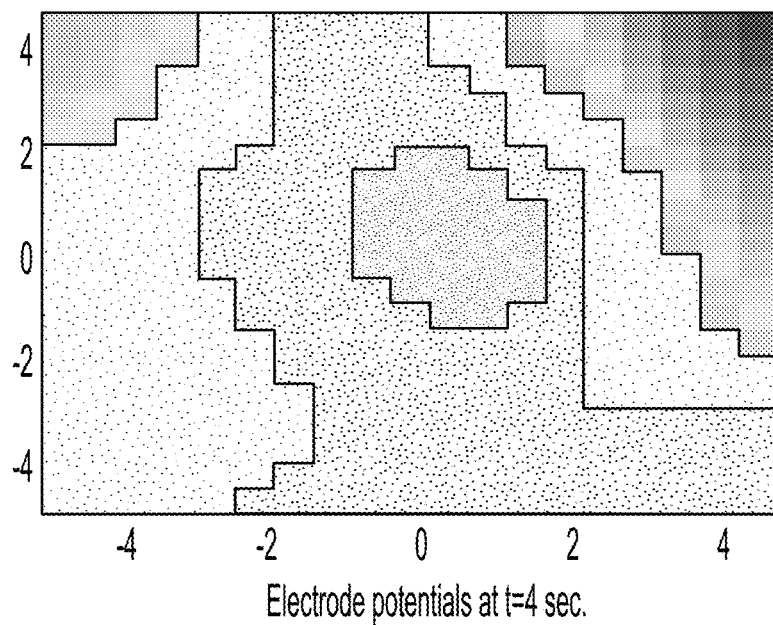
Figure 14F:
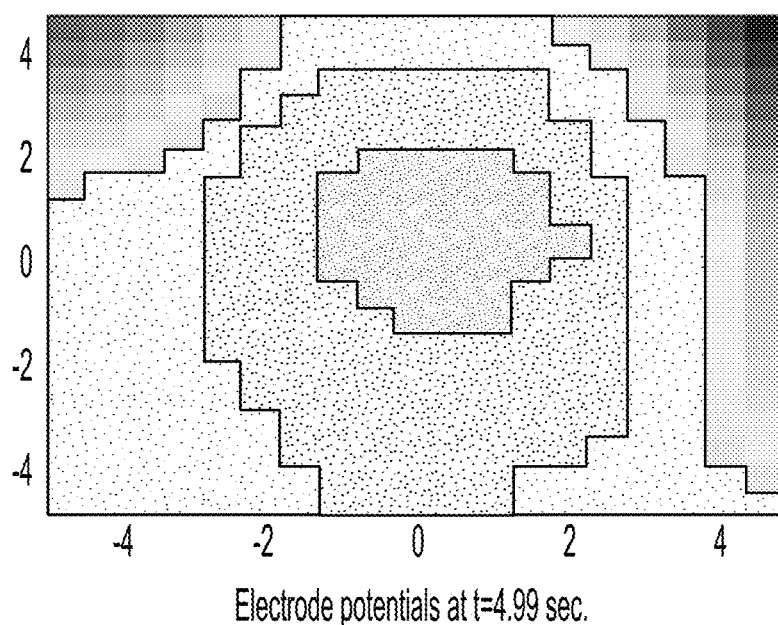

In the first example, the MPC optimizer 25 was used to generate control inputs that drove ten chiplets from a set of initial positions to a final configuration as shown with reference to FIG. 12. FIG. 12 is a diagram illustrating initial positions and final positions of chiplets moved using the system of FIG. 1 and the method of FIG. 9. The final positions were chosen so that test chiplet avoidance could be tested. The electrode array used had 400 electrodes that can be individually actuated.

The SQP algorithm was run for 1500 iterations starting from random initializations of the trajectory and input parameters. The chiplet trajectory map is a function x: $R \to R^{20}$ modeled as a NN with one hidden layer of size 20 and tan h as activation function:

$$x = W^{[1]} \tanh(W^{[0]} t + b^{[0]}) + b^{[1]},$$

where $W^{[0]} \in R^{20 \times 1}$, $b^{[0]} \in R^{20}$, $W^{[1]} \in R^{20 \times 20}$ and $b^{[1]} \in R^{20}$. The input map is a function u: $R^3 \to R^1$, modeled as a NN with one hidden layer of size 20 and tan h as activation function $$u = W^{[1]} \tanh(W^{[0]} z + b^{[0]}) + b^{[1]},$$

where, $z^T=[y^T, t]^T$, with y representing the electrode positions, $W^{[0]} \in R^{20 \times 3}$, $b^{[0]} \in R^{20}$, $W^{[1]} \in R^{1 \times 20}$ and $b^{[1]} \in R^1$. Note that the total number of parameters for u is 101, number that is 4 times smaller than the number of input variables if each electrode potential were considered a separate input. FIGS. 13(A)-13(F) are diagrams showing trajectories of ten chiplets of the first example over time derived using the SQP algorithm. The generated trajectories are such that the chiplets maintain a minimum distance between them. FIGS. 14(A)-14(F) are diagrams showing the electrode potential over time used to move the chiplets whose trajectories are shown with reference to FIGS. 13(a)-13(f). FIGS. 14(A)-14(F) depict an expected potential distribution t=0, namely a "circle" roughly following the initial distribution of the chiplet, where the electrodes on the circle have small potential. In contrast the "circle" is surrounded by positive potential in the exterior of the circle, and negative potentials on the circle interior.

Figure 15:
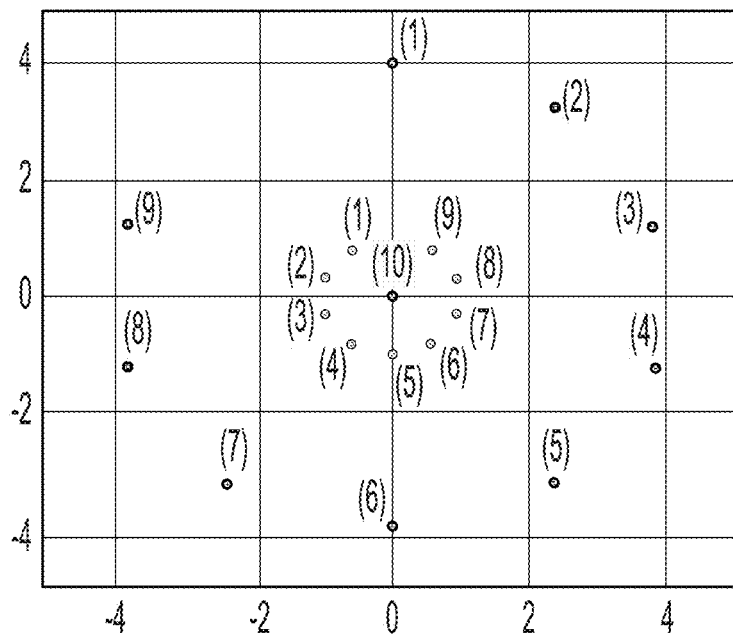
FIG. 15 is a diagram showing initial chiplet positions (green) and final chiplet positions (blue color) of the second example of chiplet movement using the system of FIG. 1 and the method of FIG. 9, with the tenth chiplet being fixed at the origin.
Figure 16A:
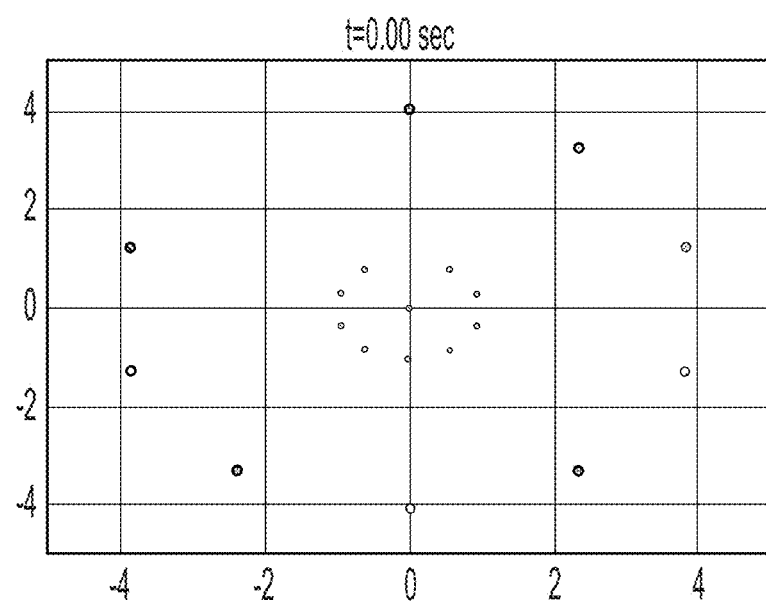
FIGS. 16(A)-16(F) are diagrams showing snapshots of the chiplet trajectory over time for the chiplets of the second example.
Figure 16B:
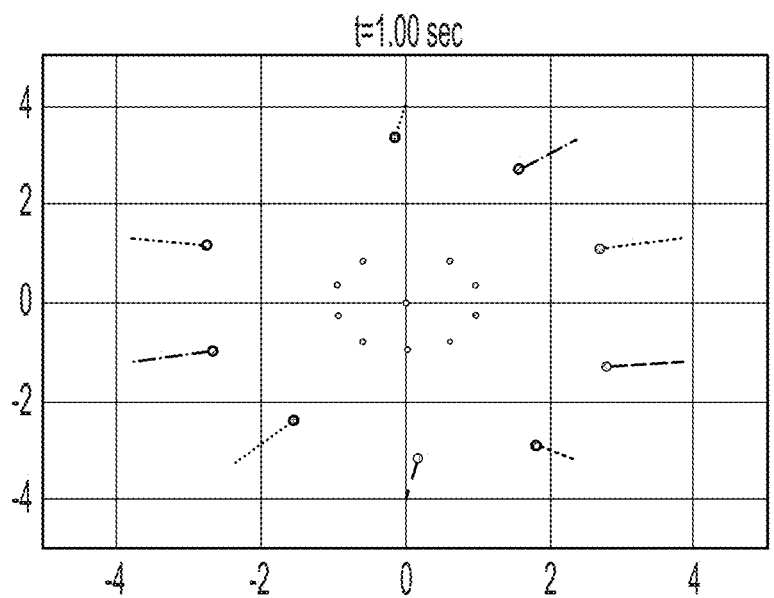
Figure 16C:
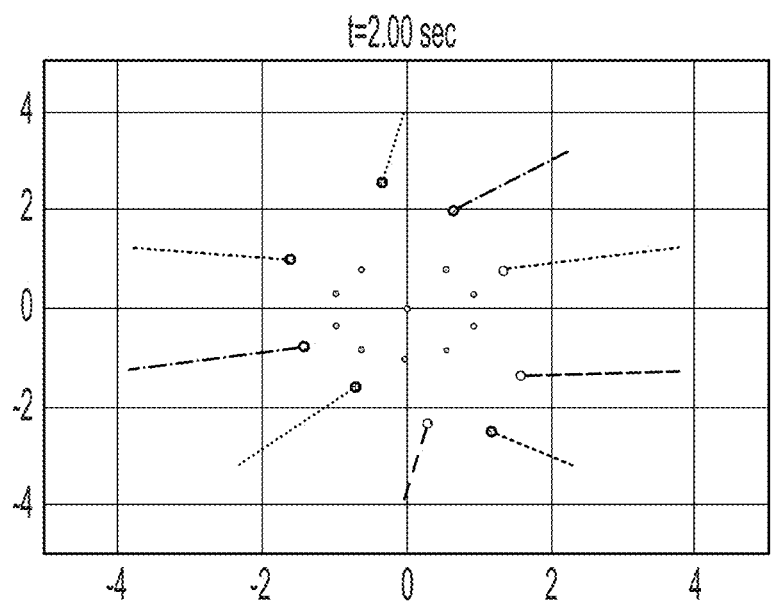
Figure 16D:
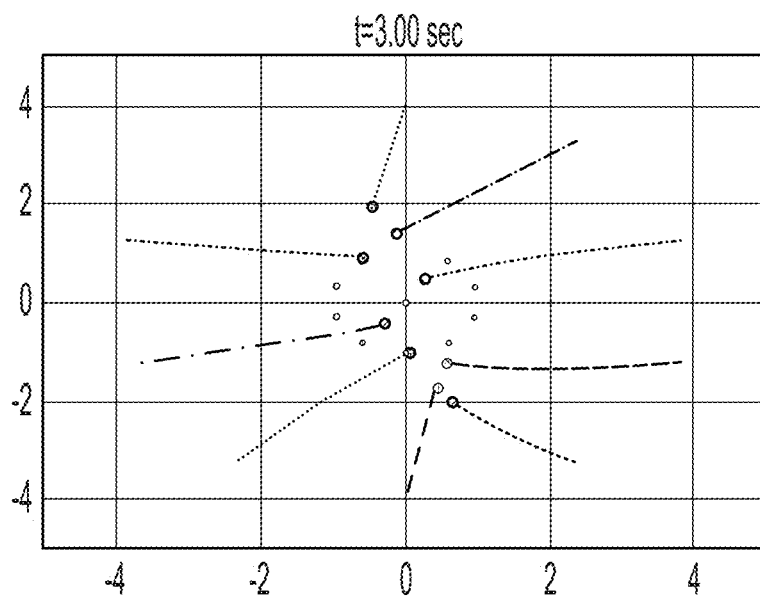
Figure 16E:
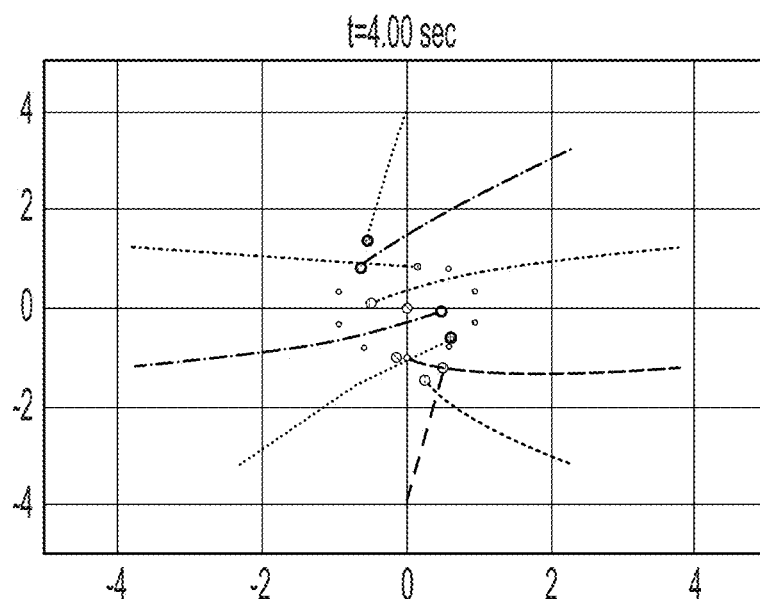
Figure 16F:
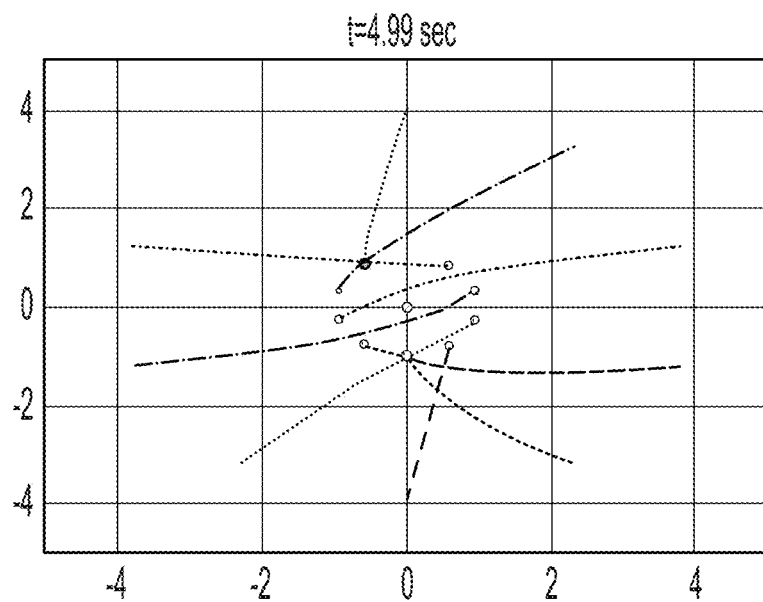
Figure 17A:
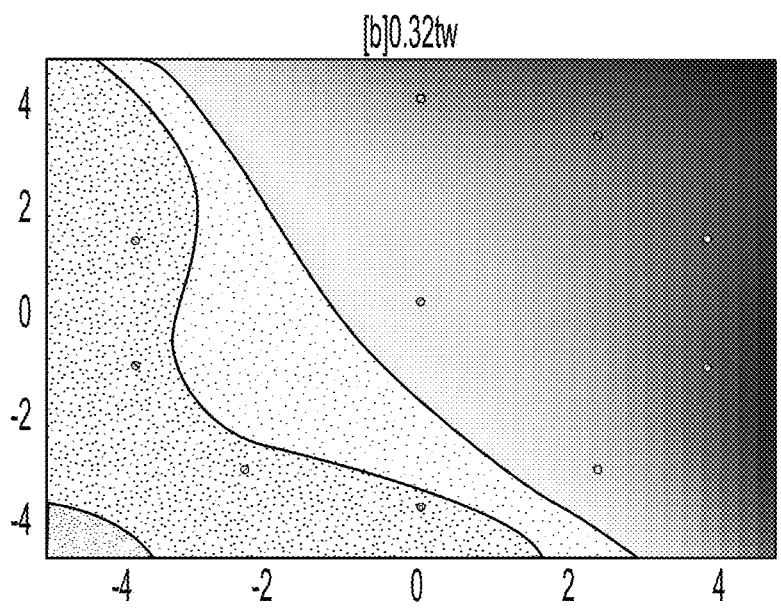
FIGS. 17(A)-17(F) are diagrams depicting snapshots of the electrode potentials over time used to move the chiplets whose trajectories are shown with reference to FIGS. 17(A)-17(F).
Figure 17B:
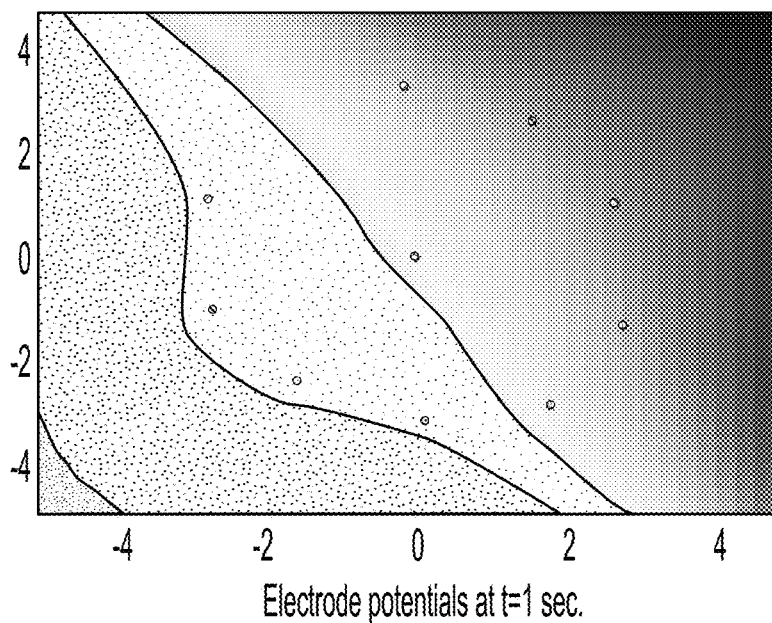
Figure 17C:
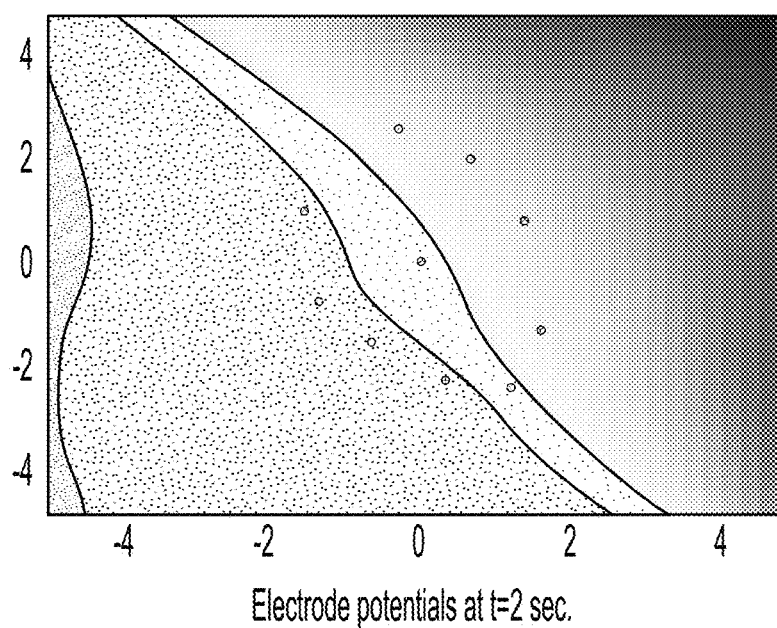
Figure 17D:
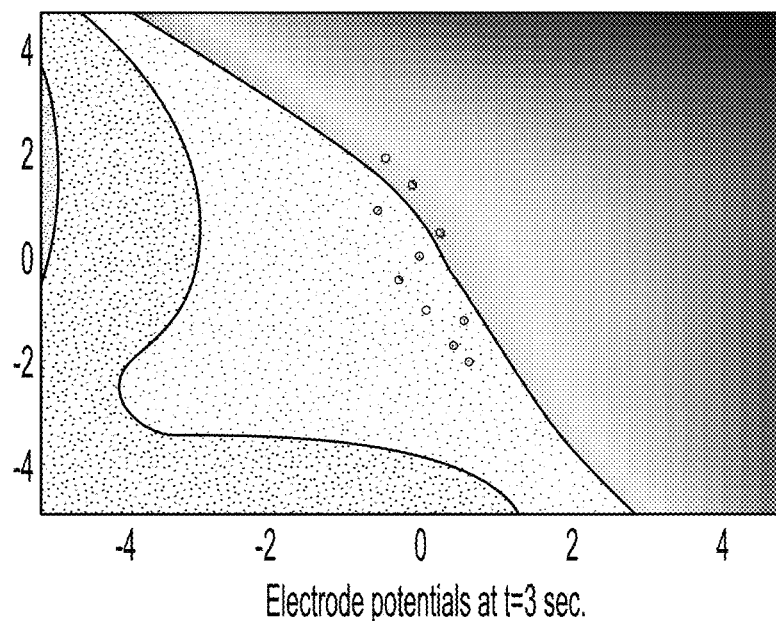
Figure 17E:
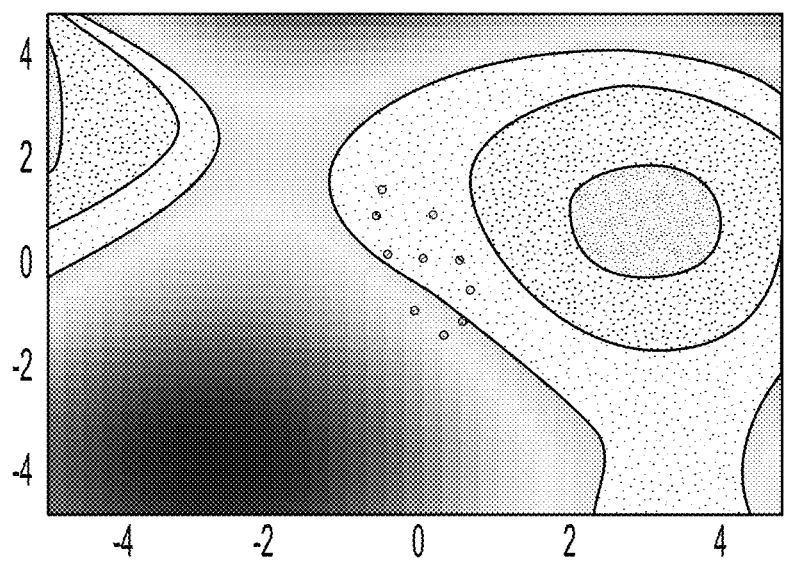
Figure 17F:
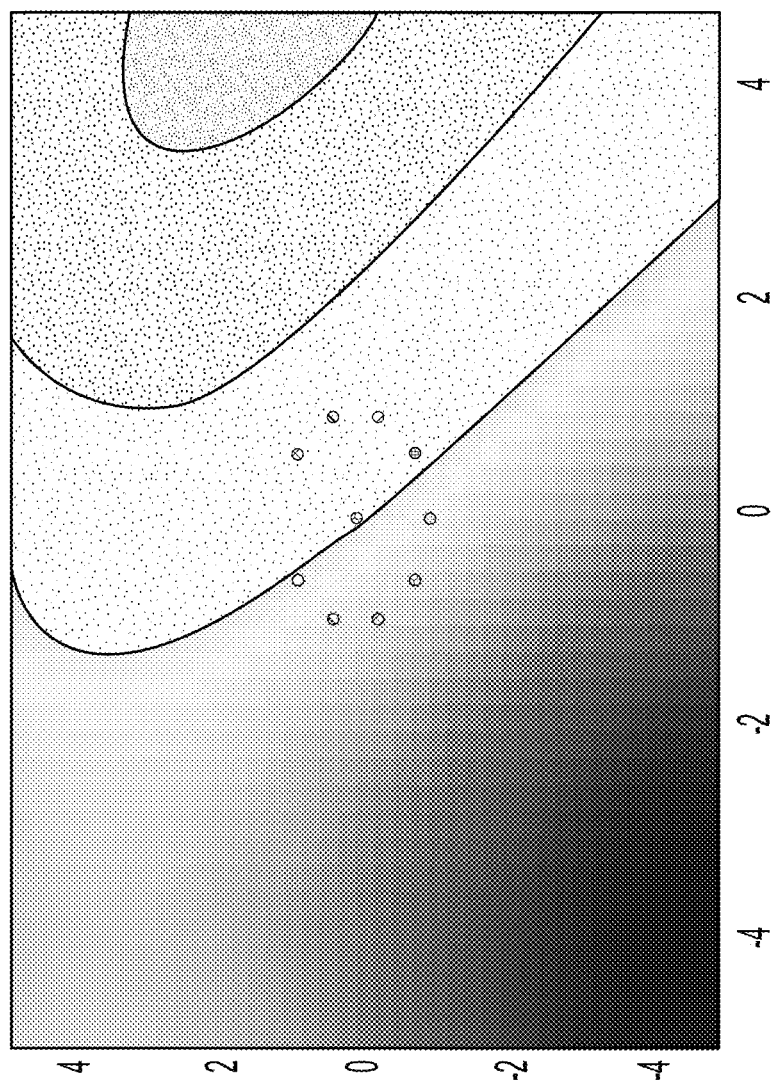

In the second example, the system and method were used to drive nine chiplets from some initial conditions to their final destination while maintaining the tenth chiplet stationary at the origin. FIG. 15 is a diagram showing initial chiplet positions (green) and final chiplet positions (blue color) of the second example of chiplet movement using the system of FIG. 1 and the method of FIG. 9, with the tenth chiplet being fixed at the origin. To enforce the tenth chiplet to remain stationary at the origin, an additional constraint is introduced, namely $x_{10}(t_k)-x_{10}(t_0)$ for all $k \geq 0$. In other words, more equality constraint are added to the nonlinear program. As compared to the first example, the number of electrodes is increased to 1600, uniformly distributed over the 5×5 array structure. FIGS. 16(A)-16(F) are diagrams showing snapshots of the chiplet trajectory over time for the chiplets of the second example. The tenth chiplet remains at the origin while the rest of the chiplets move towards their final positions.

FIGS. 17(A)-17(F) are diagrams depicting snapshots of the electrode potentials over time used to move the chiplets whose trajectories are shown with reference to FIGS. 17(A)-17(F). Each rectangle in the FIGS. 17(A)-17(F) corresponds to an electrode at the center of the rectangle. Blue and red colors depict positive and negative potentials, respectively. The magnitude of the potential are proportional to the darkness of the colors. The chiplet positions are superimposed to better interpret the electric potential allocation. The presence of a roughly "neutral" potential around the fixed chiplet at the center of the array, which is indicative of constant potential energy. In other words, the force field around the chiplet is negligible.

While the invention has been particularly shown and described as referenced to the embodiments thereof, those skilled in the art will understand that the foregoing and other changes in form and detail may be made therein without departing from the spirit and scope of the invention.

What is claimed is:

1. A system for model-predictive-control-based microassembly control with the aid of a digital computer, comprising:
   a plurality of processors configured to execute computer-executable code, the processors comprising at least one of one or more graphics processing units (GPUs) and one or more of tensor processing units (TPUs) and are configured to:
   obtain one or more parameters of a system for positioning a plurality of chiplets, each of the chiplets comprising a micro-object, the system comprising a plurality of electrodes, the electrodes configured to induce a movement of the chiplets when the chiplets are suspended in a fluid proximate to the electrodes upon a generation of one or more electric potentials by one or more of the electrodes;
   model capacitance between the chiplets and the electrodes and the electrodes and capacitance between the chiplets based on the parameters of the system;
   estimate positions of the chiplets based on images taken by at least one camera;
   receive further positions of at least some of the chiplets;
   perform model predictive control (MPC) optimization to derive based on the capacitance modeling a control scheme for moving the at least some chiplets from the positions to the further positions along trajectories and the electrode potentials necessary for the at least some chiplets to travel the along trajectories, wherein the trajectories are parametrized as smooth, time-dependent functions during the MPC optimization and the electrode potentials are parametrized as smooth time-and-space-dependent functions during the MPC optimization, wherein the processors are further configured to impose one or more constraints when performing the MPC optimization, one of the constraints comprising a minimum distance between the trajectories of the chiplets when performing the MPC optimization; and
   control the electrodes to generate the electrode potentials in the control scheme.

2. A system according to claim 1, wherein the processors comprise one or more of the GPUs and one or more of the TPUs.

3. A system according to claim 2, wherein two or more of the processors work in parallel.

4. A system according to claim 1, wherein at least one of one or more of the GPUs and one or more of the TPUs utilizes JAX Python framework when performing the MPC optimization.

5. A system according to claim 1, wherein the constraints further comprise a constraint on a magnitude of the electrode potentials and a constraint on how far the chiplets can move.

6. A system according to claim 1, the processors further configured to set one or more of the constraints based on user input.

7. A system according to claim 1, wherein a second order information of a loss function is used during the MPC optimization.

8. A system according to claim 1, the processors further configured to map the electrode potentials to a plurality of further images, wherein the further images are used to control the electrodes.

9. A system according to claim 8, the processors further configured to use a video projector to project the images to photo-transistors in control of the electrodes.

10. A method for model-predictive-control-based microassembly control with the aid of a digital computer microassembly control with the aid of a digital computer, comprising:
    obtaining by one or more of a plurality of processors configured to execute computer-executable code, the processors comprising at least one of one or more graphics processing units (GPUs) and one or more of tensor processing units (TPUs), the one or more parameters of a system for positioning a plurality of chiplets, each of the chiplets comprising a micro-object, the system comprising a plurality of electrodes, the electrodes configured to induce a movement of the chiplets when the chiplets are suspended in a fluid proximate to the electrodes upon a generation of one or more electric potentials by one or more of the electrodes;
    modeling by one or more of the plurality of processors capacitance between the chiplets and the electrodes and the electrodes and capacitance between the chiplets based on the parameters of the system;

estimating by one or more of the plurality of processors positions of the chiplets based on images taken by at least one camera;

receiving by one or more of the plurality of processors further positions of at least some of the chiplets;

performing model predictive control (MPC) optimization to derive based on the capacitance modeling a control scheme for moving the at least some chiplets from the positions to the further positions along trajectories and the electrode potentials necessary for the at least some chiplets to travel the along trajectories, wherein the trajectories are parametrized as smooth, time-dependent functions during the MPC optimization and the electrode potentials are parametrized as smooth time-and-space-dependent functions during the MPC optimization, wherein a second order information of a loss function is used during the MPC optimization; and controlling the electrodes to generate the electrode potentials in the control scheme.

11. A method according to claim 10, wherein the processors comprise one or more of the GPUs and one or more of the TPUs.

12. A method according to claim 11, wherein two or more of the processors work in parallel.

13. A method according to claim 10, wherein at least one of one or more of the GPUs and one or more of the TPUs utilizes JAX Python framework when performing the MPC optimization.

14. A method according to claim 10, further comprising imposing one or more constraints when performing the MPC optimization, one of the constraints comprising a minimum distance between the trajectories of the chiplets when performing the MPC optimization.

15. A method according to claim 14, wherein the constraints further comprise a constraint on a magnitude of the electrode potentials and a constraint on how far the chiplets can move.

16. A method according to claim 14, further comprising setting one or more of the constraints based on user input.

17. A method according to claim 10, further comprising mapping the electrode potentials to a plurality of further images, wherein the further images are used to control the electrodes.

18. A method according to claim 17, further comprising using a video projector to project the images to phototransistors in control of the electrodes.

19. A system for model-predictive-control-based microassembly control with the aid of a digital computer, comprising:

a plurality of processors configured to execute computer-executable code, the processors comprising at least one of one or more graphics processing units (GPUs) and one or more of tensor processing units (TPUs) and are configured to:

obtain one or more parameters of a system for positioning a plurality of chiplets, each of the chiplets comprising a micro-object, the system comprising a plurality of electrodes, the electrodes configured to induce a movement of the chiplets when the chiplets are suspended in a fluid proximate to the electrodes upon a generation of one or more electric potentials by one or more of the electrodes;

model capacitance between the chiplets and the electrodes and the electrodes and capacitance between the chiplets based on the parameters of the system;

estimate positions of the chiplets based on images taken by at least one camera;

receive further positions of at least some of the chiplets;

perform model predictive control (MPC) optimization to derive based on the capacitance modeling a control scheme for moving the at least some chiplets from the positions to the further positions along trajectories and the electrode potentials necessary for the at least some chiplets to travel the along trajectories, wherein the trajectories are parametrized as smooth, time-dependent functions during the MPC optimization and the electrode potentials are parametrized as smooth time-and-space-dependent functions during the MPC optimization, wherein a second order information of a loss function is used during the MPC optimization; and control the electrodes to generate the electrode potentials in the control scheme.

* * * * *